US010541282B2

(12) United States Patent
Oh et al.

(10) Patent No.: US 10,541,282 B2
(45) Date of Patent: *Jan. 21, 2020

(54) ORGANIC LIGHT EMITTING DISPLAY HAVING TOUCH SENSORS AND METHOD OF FABRICATING THE SAME, AND DISPLAY DEVICE

(71) Applicant: LG Display Co., Ltd., Seoul (KR)

(72) Inventors: Jae-Young Oh, Goyang-si (KR); Min-Joo Kim, Seoul (KR); Jae-Won Lee, Goyang-si (KR); Eun-Hye Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/134,931

(22) Filed: Sep. 18, 2018

(65) Prior Publication Data
US 2019/0035860 A1    Jan. 31, 2019

Related U.S. Application Data

(63) Continuation of application No. 15/436,505, filed on Feb. 17, 2017, now Pat. No. 10,109,686.

(30) Foreign Application Priority Data
Aug. 31, 2016  (KR) .......................... 10-2016-0112192

(51) Int. Cl.
H01L 27/32       (2006.01)
H01L 51/52       (2006.01)
(Continued)

(52) U.S. Cl.
CPC ............ H01L 27/323 (2013.01); G06F 3/044 (2013.01); G06F 3/0412 (2013.01);
(Continued)

(58) Field of Classification Search
CPC ..................... H01L 27/323; H01L 27/3246; H01L 51/5253
See application file for complete search history.

(56) References Cited

U.S. PATENT DOCUMENTS 9,853,092 B2    12/2017  Lee et al.
10,109,686 B2 * 10/2018  Oh ..................... H01L 27/3246
(Continued)

FOREIGN PATENT DOCUMENTS

CN    103855188 A    6/2014
CN    103901690 A    7/2014
(Continued)

OTHER PUBLICATIONS

Extended European Search Report for European Patent Application No. EP 17155964.4, dated Aug. 29, 2017, 9 Pages.
(Continued)

Primary Examiner — Ngan V Ngo
(74) Attorney, Agent, or Firm — Fenwick & West LLP

(57) ABSTRACT

Disclosed is a display device comprising: a substrate comprising an active region and a non-active region; a light emitting device that emits light in the active area of the substrate; a touch sensor in the active area of the substrate that senses touch of the display device, the touch sensor including a plurality of conductive layers arranged in a stacking sequence; and a plurality of routing lines in the non-active region of the substrate that are connected to the touch sensor, each of the plurality of routing lines including a plurality of routing layers, each of the plurality of routing layers made of a same material as a corresponding one of the plurality of conductive layers included in the touch sensor, and the plurality of routing layers arranged in a same stacking sequence as the stacking sequence of the plurality of conductive layers of the touch sensor.

40 Claims, 37 Drawing Sheets

(51) Int. Cl.
*G06F 3/041* (2006.01)
*G06F 3/044* (2006.01)

(52) U.S. Cl.
CPC ...... *H01L 27/3246* (2013.01); *H01L 27/3279* (2013.01); *H01L 51/5253* (2013.01); *G06F 2203/04112* (2013.01); *H01L 2227/323* (2013.01)

(56) References Cited

U.S. PATENT DOCUMENTS

| | | | |
|---|---|---|---|
| 2014/0078077 A1* | 3/2014 | Choi | H01L 27/323 345/173 |
| 2014/0138141 A1 | 5/2014 | Li et al. | |
| 2014/0152912 A1 | 6/2014 | Lee et al. | |
| 2015/0185915 A1* | 7/2015 | Lim | G06F 3/044 345/174 |
| 2015/0270291 A1 | 9/2015 | Tian et al. | |
| 2016/0117031 A1* | 4/2016 | Han | G06F 3/0412 345/174 |
| 2016/0350570 A1* | 12/2016 | Han | G06K 9/0002 |
| 2017/0308228 A1* | 10/2017 | Benkley, III | G06K 9/00013 |
| 2018/0204886 A1* | 7/2018 | Lee | H01L 27/323 |

FOREIGN PATENT DOCUMENTS

| | | |
|---|---|---|
| KR | 20130110539 | 10/2013 |
| KR | 101403563 | 6/2014 |
| KR | 20150001019 | 1/2015 |
| KR | 20160005879 | 1/2016 |
| TW | 201023002 | 6/2010 |
| TW | M483482 U | 8/2014 |
| TW | 201520845 A | 6/2015 |

OTHER PUBLICATIONS

Office Action for Korean Patent Application No. KR 10-2016-0112192, dated Nov. 20, 2017, 7 Pages.
Taiwanese Intellectual Property Office, Office Action, Taiwanese Patent Application No. 106113064, dated Mar. 5, 2018, eight pages.
United States Office Action, U.S. Appl. No. 15/436,505, dated Feb. 16, 2018, eight pages.
Taiwan Intellectual Property Office, Office Action, TW Patent Application No. 107127105, dated Sep. 20, 2018, ten pages.
Taiwan Intellectual Property Office, Office Action, TW Patent Application No. 108109611, dated Aug. 28, 2019, eight pages.

* cited by examiner

ORGANIC LIGHT EMITTING DISPLAY HAVING TOUCH SENSORS AND METHOD OF FABRICATING THE SAME, AND DISPLAY DEVICE

CROSS-REFERENCE TO RELATED APPLICATIONS

This application is a continuation application of U.S. patent application Ser. No. 15/436,505 filed on Feb. 17, 2017, which claims the benefit of Korean Patent Application No. 10-2016-0112192, filed on Aug. 31, 2016, all of which are incorporated by reference as if fully set forth herein.

BACKGROUND

Field of Technology

The present disclosure relates to an organic light emitting display having touch sensors and a method of fabricating the same and a display device, and more particularly, to an organic light emitting display having touch sensors which may achieve process simplification and cost reduction, and a method of fabricating the same and a display device.

Discussion of the Related Art

A touchscreen is an input device through which a user may input a command by selecting instructions displayed on a screen of a display using a hand or an object. That is, the touchscreen converts a contact position directly contacting a human hand or an object into an electrical signal and receives instructions selected at the contact position as an input signal. Such a touchscreen may substitute for a separate input device connected to a display and operated, such as a keyboard or a mouse, and thus applications of the touchscreen have gradually increased.

In general, a touchscreen is attached to the front surface of a display panel, such as a liquid crystal display panel or an organic electroluminescent display panel, by an adhesive. In this case, since the touchscreen is separately manufactured and then attached to the front surface of the display panel, an attachment process is additionally carried out and thus the overall fabrication process becomes complicated and manufacturing costs are raised.

SUMMARY

Accordingly, the present disclosure is directed to an organic light emitting display having touch sensors and a method of fabricating the same that substantially obviate one or more problems due to limitations and disadvantages of the related art.

An object of the present disclosure is to provide an organic light emitting display having touch sensors which may achieve process simplification and cost reduction, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display includes a light emitting device disposed in an active area of a substrate that displays images, an encapsulation part disposed on the light emitting device, the encapsulation part including a plurality of inorganic encapsulation layers and at least one organic encapsulation layer, a plurality of touch sensing lines and a plurality of touch driving lines disposed on the encapsulation part, the plurality of touch sensing lines and the plurality of touch driving lines intersecting each other in the active area, and the plurality of touch driving lines and the plurality of touch sensing lines each including a plurality of conductive layers arranged in a stacking sequence, a plurality of routing lines connected to the plurality of touch sensing lines and the plurality of touch driving lines, each of the plurality of routing lines including a plurality of routing layers, each of the plurality of routing layers made of a same material as a corresponding one of the plurality of conductive layers and the plurality of routing layers in a same stacking sequence as the stacking sequence of the plurality of conductive layers.

A method of fabricating an organic light emitting display comprises: forming a light emitting device disposed in an active area of a substrate that displays images; forming an encapsulation part including a plurality of inorganic encapsulation layers and at least one organic encapsulation layer on the light emitting device; and forming a plurality of touch sensing lines, a plurality of touch driving lines, and a plurality of routing lines on the encapsulation part, wherein the plurality of touch sensing lines and the plurality of touch driving lines intersect each other in the active area, and the plurality of touch driving lines and the plurality of touch sensing lines each include a plurality of conductive layers arranged in a stacking sequence; and wherein each of the plurality of routing lines include a plurality of routing layers, each of the plurality of routing layers made of a same material as a corresponding one of the plurality of conductive layers and the plurality of routing layers in a same stacking sequence as the stacking sequence of the plurality of conductive layers.

In one embodiment, a display device comprises: a substrate comprising an active region that displays images and a non-active region that does not display images; a light emitting device that emits light in the active area of the substrate; a touch sensor in the active area of the substrate that senses touch of the display device, the touch sensor over the light emitting device and including a plurality of conductive layers, the plurality of conductive layers arranged in a stacking sequence; and a plurality of routing lines in the non-active region of the substrate that are connected to the touch sensor, each of the plurality of routing lines including a plurality of routing layers, each of the plurality of routing layers made of a same material as a corresponding one of the plurality of conductive layers included in the touch sensor, and the plurality of routing layers arranged in a same stacking sequence as the stacking sequence of the plurality of conductive layers of the touch sensor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the embodiments of the present invention, examples of which are illustrated in the accompanying drawings. Wherever possible, the same reference numbers will be used throughout the drawings to refer to the same or like parts.

Figure 1:
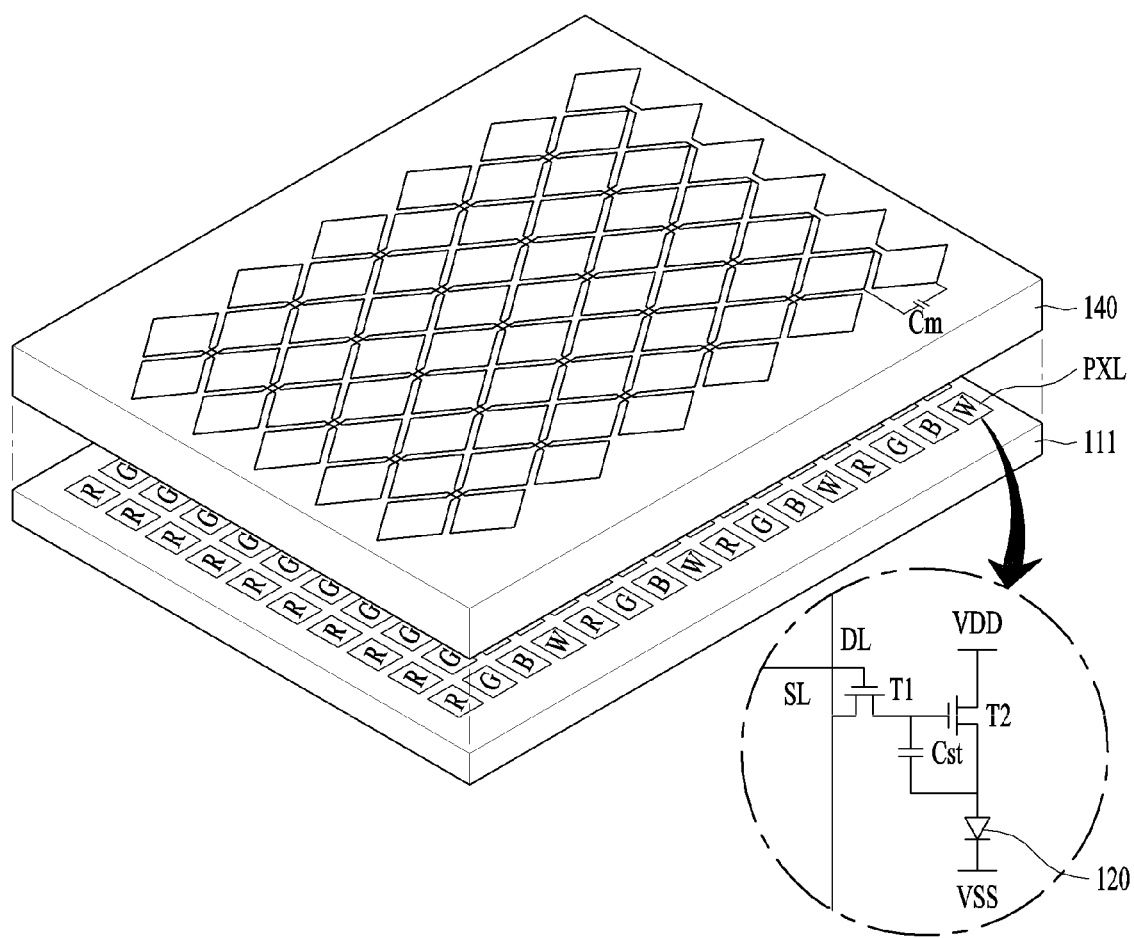
FIG. 1 is a perspective view of an organic light emitting display having touch sensors in accordance with one embodiment of the present disclosure.

FIG. 1 is a perspective view of an organic light emitting display having touch sensors in accordance with one embodiment of the present disclosure.

Figure 2:
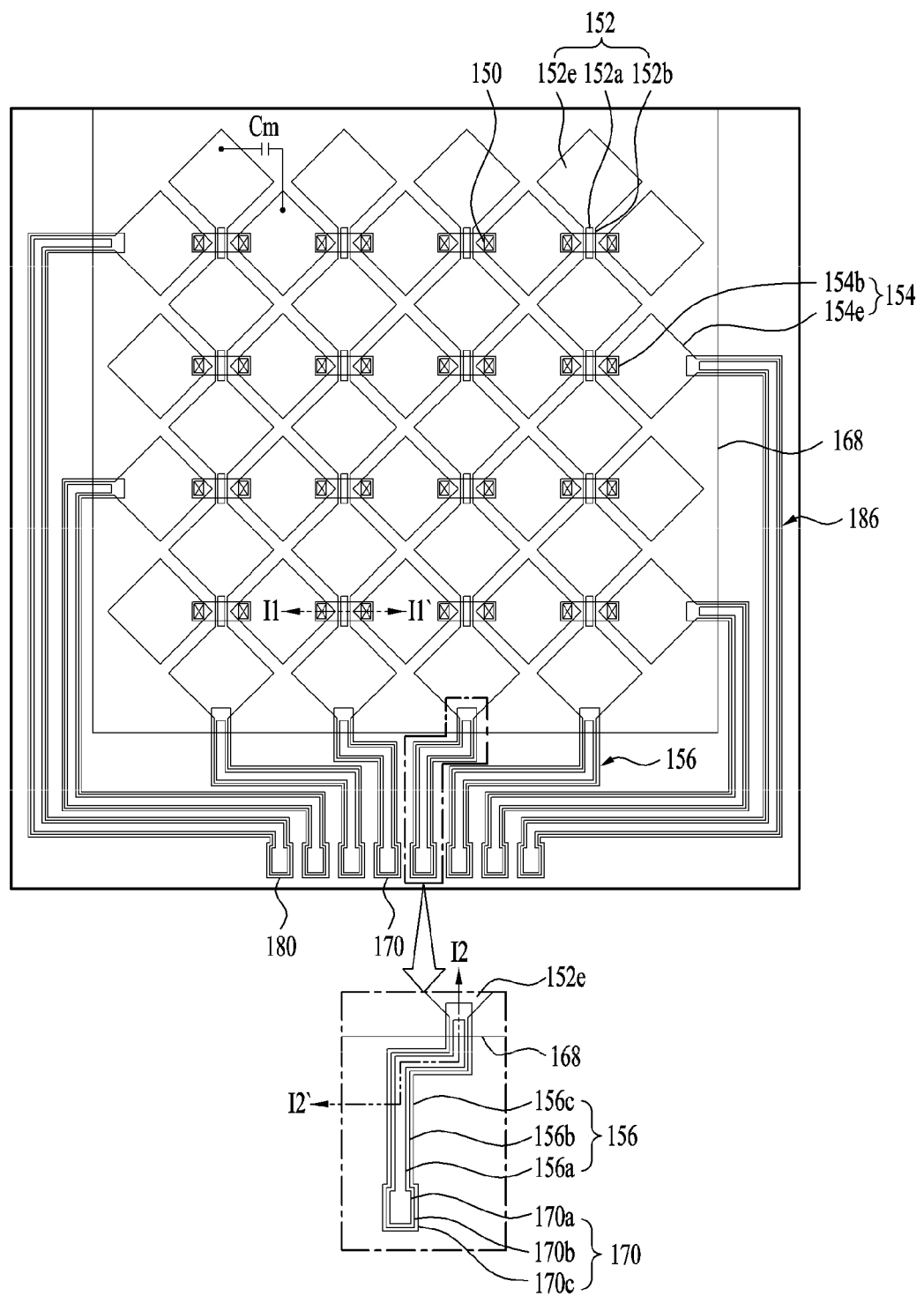
FIG. 2 is a plan view of the organic light emitting display shown in FIG. 1 in accordance with one embodiment of the present disclosure.

An organic light emitting display having touch sensors shown in FIG. 1 senses whether or not a user touch occurs and a touch position by sensing a change of mutual capacitance Cm caused by the user touch through touch electrodes 152e and 154e shown in FIG. 2 for a period of touch time. Further, the organic light emitting display shown in FIG. 1 displays an image through unit pixels including light emitting devices 120. The unit pixel includes red (R), green (G) and blue (B) sub-pixels PXL, or includes red (R), green (G), blue (B) and white (W) sub-pixels PXL.

Each sub-pixel PXL includes a pixel drive circuit and a light emitting device 120 connected to the pixel drive circuit.

The pixel drive circuit includes a switching transistor T1, a driving transistor T2, and a storage capacitor Cst.

The switching transistor T1 is turned on, when a scan pulse is supplied to a scan line SL, and supplies a data signal, supplied to a data line DL, to the storage capacitor Cst and a gate electrode of the driving transistor T2.

The driving transistor T2 controls current I supplied to the light emitting device 120 from a high voltage (VDD) line 161, thus adjusting a light emission amount of the light emitting device 120. Further, even if the switching transistor T1 is turned off, the driving transistor T2 supplies designated current I by voltage charging the storage capacitor Cst until a data signal of the next frame is supplied and, thus, light emission by the light emitting device 120 is maintained.

Figure 3:
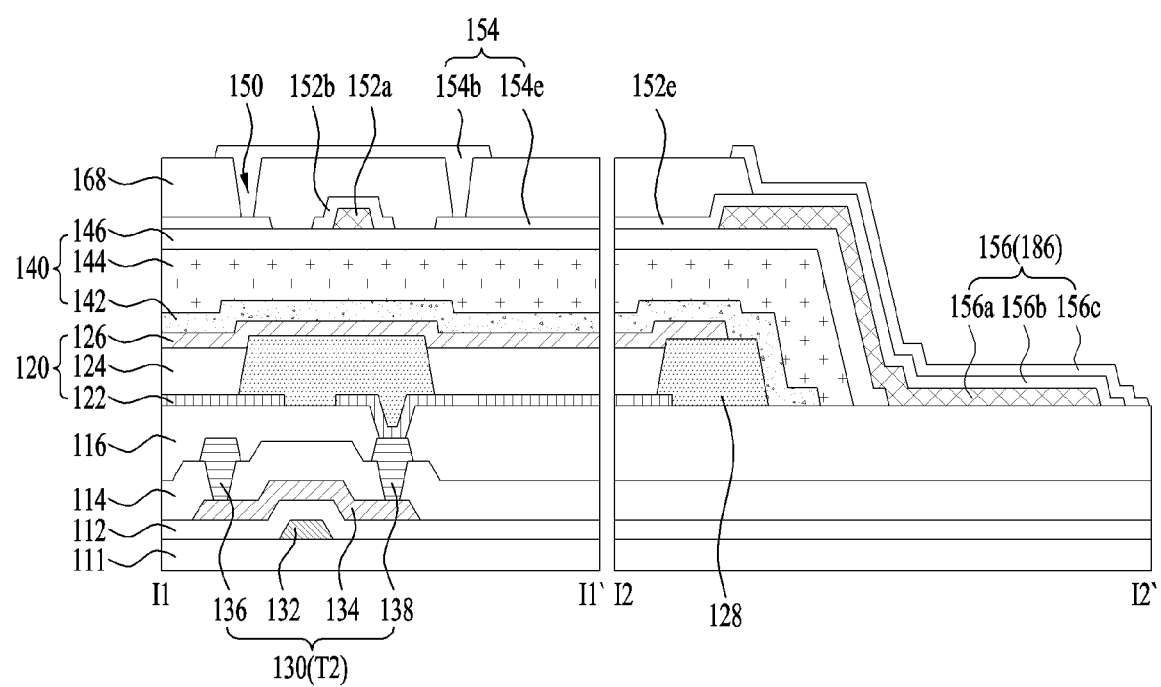
FIG. 3 is a cross-sectional view of the organic light emitting display, taken along lines I1-I1' and I2-I2' of FIG. 2 in accordance with one embodiment of the present disclosure.

Such a driving thin film transistor T2(130) includes, as exemplarily shown in FIG. 3, a gate electrode 132, a semiconductor layer 134 overlapping the gate electrode 132 with a gate insulating film 112 interposed therebetween, and source and drain electrodes 136 and 138 formed on a passivation film 114 and contacting the semiconductor layer 134.

The light emitting device 120 is disposed in an active area of a substrate 111 and includes an anode 122, an organic light emitting layer 124 formed on the anode 122, and a cathode 126 formed on the organic light emitting layer 124.

The anode 122 is conductively connected to the drain electrode 138 of the driving thin film transistor 130 exposed through a pixel contact hole formed through a planarization film 116. The organic light emitting layer 124 is formed on the anode 122 in an emission region provided by a bank 128. The organic light emitting layer 124 is formed by stacking a hole-related layer, a light emitting layer and an electron-related layer on the anode 122 in regular order or in reverse order. The cathode 126 is formed opposite the anode 122 with the organic light emitting layer 124 interposed therebetween.

An encapsulation part 140 prevents external moisture or oxygen from permeating the light emitting device 120, which is vulnerable to external moisture or oxygen. For this purpose, the encapsulation part 140 includes a plurality of inorganic encapsulation layers 142 and 146 and an organic encapsulation layer 144 disposed between the inorganic encapsulation layers 142 and 146, and the inorganic encapsulation layer 146 is disposed as the uppermost layer. Here, the encapsulation part 140 includes at least two inorganic encapsulation layers 142 and 146 and at least one organic encapsulation layer 144. In the present disclosure, the structure of the encapsulation part 140 in which the organic encapsulation layer 144 is disposed between the first and second inorganic encapsulation layers 142 and 146 will be exemplarily illustrated.

The first inorganic encapsulation layer 142 is formed on the substrate 111 provided with the cathode 126 so as to be located most adjacent to the light emitting device 120. Such a first inorganic encapsulation layer 142 is formed of an inorganic insulating material which may be deposited at a low temperature, such as silicon nitride ($SiN_x$), silicon oxide ($SiO_x$), silicon oxynitride (SiON) or aluminum oxide ($Al_2O_3$). Therefore, the first inorganic encapsulation layer 142 is deposited in a low-temperature atmosphere and, thus, during a deposition process of the first inorganic encapsulation layer 142, damage to the organic light emitting layer 124, which is vulnerable to a high-temperature atmosphere, may be prevented.

The organic encapsulation layer 144 serves as a buffer to damp stress between respective layers according to bending of the organic light emitting display and strengthens planarization performance of the organic light emitting display. The organic encapsulation layer 144 is formed of an organic insulating material, such as acrylic resin, epoxy resin, polyimide, polyethylene or silicon oxycarbide (SiOC).

The second inorganic encapsulation layer 146 is formed on the substrate 111 provided with the organic encapsulation layer 144 formed thereon so as to cover the upper and side surfaces of the organic encapsulation layer 144 and the first inorganic encapsulation layer 142. Therefore, the second inorganic encapsulation layer 146 minimizes or blocks penetration of external moisture or oxygen into the first inorganic encapsulation layer 142 and the organic encapsulation layer 144. Such a second inorganic encapsulation layer 146 is formed of an inorganic insulating material, such as silicon nitride ($SiN_x$), silicon oxide ($SiO_x$), silicon oxynitride (SiON) or aluminum oxide ($Al_2O_3$).

Touch sensing lines 154 and touch driving lines 152 are disposed on the encapsulation part 140 so as to intersect each other with a touch insulating film 168 interposed therebetween, as exemplarily shown in FIGS. 2 and 3.

The touch driving line 152 includes a plurality of first touch electrodes 152e and first bridges 152b conductively connecting the first touch electrodes 152e.

The first touch electrodes 152e are spaced apart from each other by designated intervals in the Y direction on the encapsulation part 140. Each of the first touch electrodes 152e is conductively connected to the adjacent first touch electrode 152e through the first bridge 152b.

The first bridges 152b are disposed on the encapsulation part 140 coplanar with the first touch electrodes 152e and are conductively connected to the first touch electrodes 152e without separate contact holes. The first bridges 152b are disposed so as to overlap the bank 128 and thus reduction of an aperture ratio by the first bridges 152b may be prevented.

If the first bridges 152b and the first touch electrodes 152e are formed of a transparent conductive film, auxiliary bridges 152a directly contacting the first bridges 152b are formed under the first bridges 152b. The auxiliary bridges 152a are formed of a first conductive layer having a monolayer structure or a multilayer structure using at least one of materials having high conductivity, such as Al, Ti, Cu, Mo and MoTi, and compensate for resistances of the first bridges 152b and the first touch electrodes 152e, formed of a second conductive layer, i.e., a transparent conductive film.

The touch sensing line 154 includes a plurality of second touch electrodes 154e and second bridges 154b conductively connecting the second touch electrodes 154e.

The second touch electrodes 154e are spaced apart from each other by designated intervals in the X direction on the encapsulation part 140. Each of the second touch electrodes 154e is conductively connected to the adjacent second touch electrode 154e through the second bridge 154b.

The second bridges 154b are disposed on the touch insulating film 168 and are conductively connected to the second touch electrodes 154e exposed through touch contact holes 150 formed through the touch insulating film 168. The second bridges 154b are disposed so as to overlap the bank 128 in the same manner as the first bridges 152b and thus reduction of the aperture ratio by the second bridges 154b may be prevented.

Since the touch sensing lines 154 intersect the touch driving lines 152 with the touch insulating film 168 interposed therebetween, as described above, mutual capacitances Cm are formed at the intersections between the touch sensing lines 154 and the touch driving lines 152. The mutual capacitances Cm are electrically charged by touch driving pulses supplied to the touch driving lines 152 and discharge to the touch sensing lines 154, thus serving as touch sensors.

The touch driving lines 152 of the present disclosure are connected to a touch driving unit (not shown) through first routing lines 156 and touch driving pads 170, disposed in an inactive (bezel) area. Thereby, the first routing line 156 transmits a touch driving pulse from the touch driving pad 170 to the touch driving line 152. Further, the touch sensing lines 154 are connected to the touch driving unit through second routing lines 186 and touch sensing pads 180, disposed in the inactive (bezel) area. Thereby, the second routing line 186 transmits a touch signal from the touch sensing line 154 to the touch sensing pad 180.

Each of the touch driving pads 170 and the touch sensing pads 180 is formed to have a tri-layer structure, formed, for example, by sequentially stacking first to third pad layers 170a, 170b and 170c using first to third conductive layers.

Each of the first and second routing lines 156 and 186 is formed to have a multilayer structure, for example, formed by sequentially stacking first to third routing layers 156a, 156b and 156c. Here, the first to third routing layers 156a, 156b and 156c are stacked so as to correspond to a stacking sequence and materials of a plurality of conductive layers disposed on the encapsulation part 140 in the active area.

That is, the auxiliary bridges 152a formed of a first opaque conductive layer, the first bridges 152b formed of a second transparent conductive layer, and the second bridges 154b formed of a third transparent conductive layer are sequentially stacked on the encapsulation part 140 in the active area. Therefore, each of the first and second routing lines 156 and 186 is formed by sequentially stacking the first routing layer 156a formed of the first opaque conductive layer, the second routing layer 156b formed of the second transparent conductive layer, and the third routing layer 156c formed of the third transparent conductive layer so as to correspond to the stacking sequence of the conductive layers on the encapsulation part 140 in the active area.

Here, the first routing layer 156a is formed of a first conductive layer having a monolayer structure or a multilayer structure using Al, Ti, Cu, Mo, MoTi. The second routing layer 156b extends from each of the first and second touch electrodes 152e and 154e and is formed of a second conductive layer including a transparent conductive film, such as ITO, IZO, ZnO, IGZO or ITO/Ag/ITO, or a conductive polymer. The third routing layer 156c is formed of a third conductive layer including a transparent conductive film, such as ITO, IZO, ZnO, IGZO or ITO/Ag/ITO, or a conductive polymer.

Figure 4A:
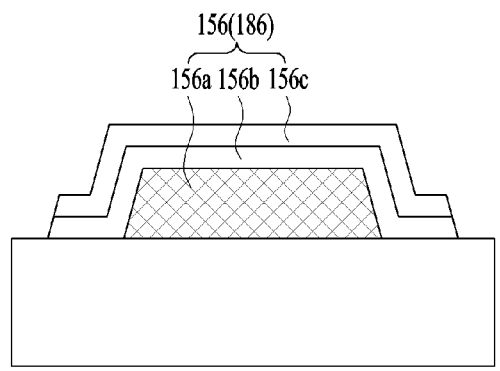
FIGS. 4A to 4C are cross-sectional views illustrating routing lines shown in FIG. 3 in accordance with different embodiments.
Figure 4B:
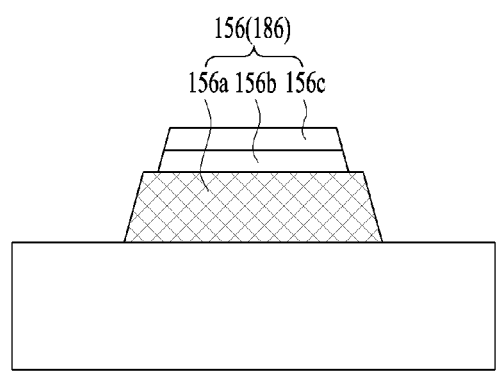
Figure 4C:
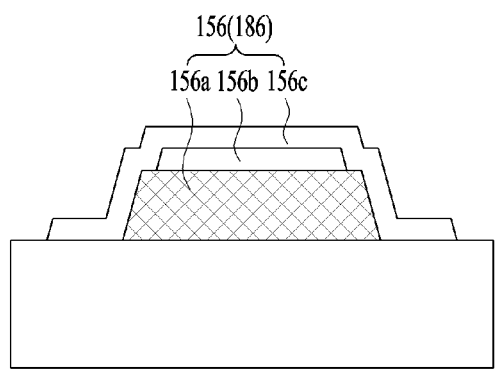

If the second routing layer 156b and the third routing layer 156c are formed of the same material, the third routing layer 156c may be formed on the second routing layer 156b to have the same line width as that of the second routing layer 156b, as exemplarily shown in FIGS. 4A and 4B, or, the third routing layer 156c may be formed on the second routing layer 156b to have a greater line width than that of the second routing layer 156b so as to cover the side and upper surfaces of the second routing layer 156b, as exemplarily shown in FIG. 4C. Therefore, etching of the second routing layer 156b formed of the same material as the third routing layer 156c by an etching solution or etching gas used in formation of the third routing layer 156c may be prevented. Further, the side surface of the third routing layer 156c adjacent to each of the first and second touch electrodes 152e and 154e is disposed on the touch insulating film 168. Therefore, the touch insulating film 168 protects the second routing layer 156b during formation of the third routing layer 156c, thus preventing etching of the second routing layer 156b formed of the same material as the third routing layer 156c.

Further, if etching characteristics (for example, etching gases or etching solutions) of materials of the first and second routing layers 156a and 156b are the same, the second routing layer 156b is formed on the first routing layer 156a to have a greater line width than that of the first routing layer 156a so as to cover the side and upper surfaces of the first routing layer 156a, as exemplarily shown in FIGS. 4A and 4C. Therefore, etching of the first routing layer 156a having the same material as the second routing layer 156b by an etching solution or etching gas used in formation of the second routing layer 156b may be prevented.

Further, if etching characteristics of materials of the first and second routing layers 156a and 156b are different, the second routing layer 156b is formed on the first routing layer 156a to have a line width which is the same as or different from that of the first routing layer 156a. For example, the second routing layer 156b may be formed on the first routing layer 156a to have a narrower line width than that of the first routing layer 156a, as exemplarily shown in FIG. 4B.

As such, each of the first and second routing lines 156 and 186 is formed to have a multilayer structure and, if a break in any one of a plurality of routing conductive layers included in each of the first and second routing lines 156 and 186 occurs, each of a touch driving pulse and a touch signal is transmitted through the remaining routing conductive layers.

As described above, the organic light emitting display in accordance with this embodiment of the present disclosure includes the first and second routing lines 156 and 186 formed of a plurality of routing layers, stacked in a stacking sequence of the touch driving lines 152 and the touch sensing lines 154. The first and second routing lines 156 and 186 have a multilayer structure and, thus, a break of the first and second routing lines 156 and 186 may be prevented. Further, while a touchscreen is attached to a conventional organic light emitting display by an adhesive, in the organic light emitting display in accordance with the present disclosure, the touch electrodes 152e and 154e are directly stacked on the encapsulation part 140 without a separate attachment process and thus the overall fabrication process may be simplified and manufacturing costs may be reduced.

FIGS. 5A to 5D are plan and cross-sectional views illustrating a method of fabricating the organic light emitting display shown in FIGS. 2 and 3 in accordance with one embodiment.

Figure 5A:
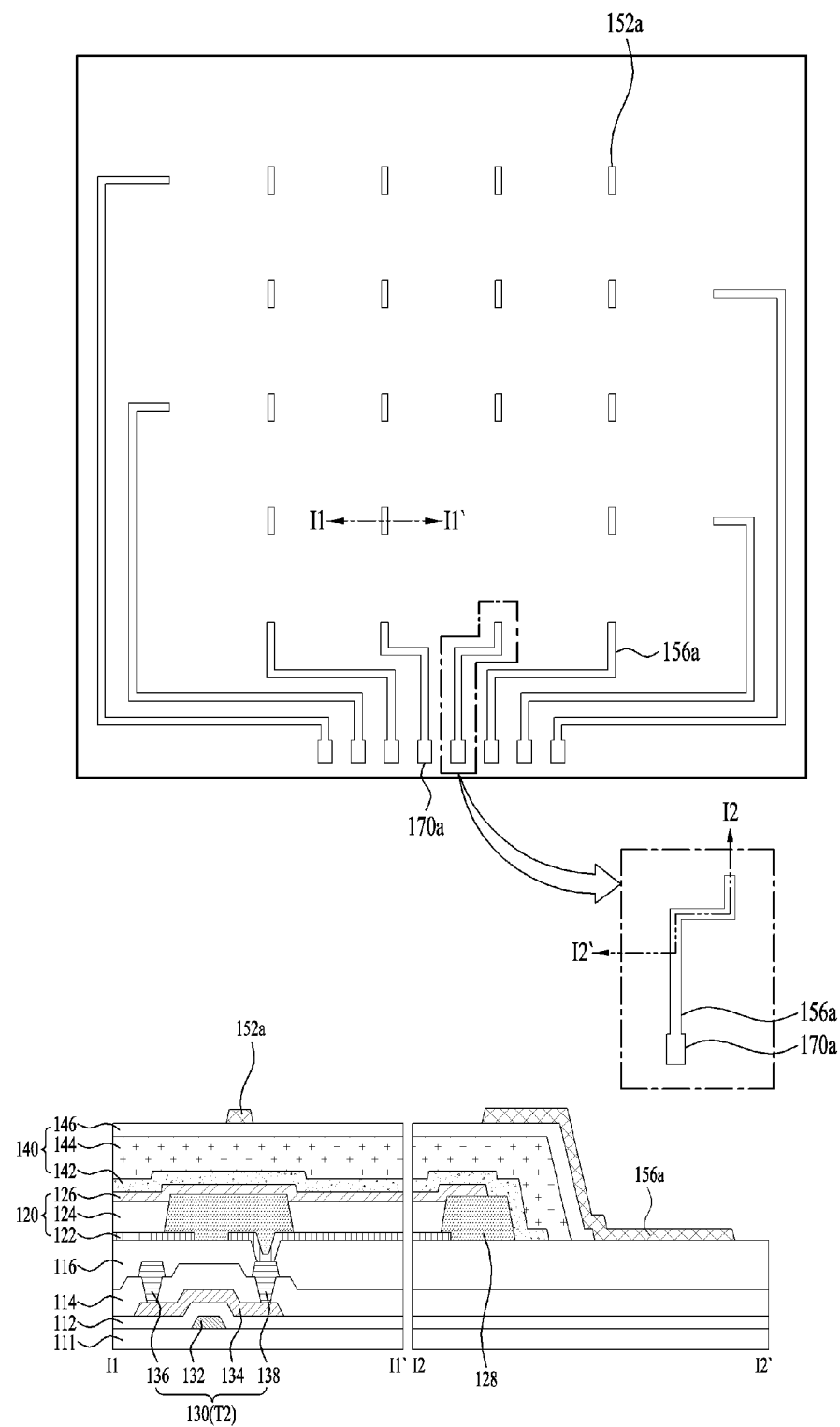
FIGS. 5A to 5D are views illustrating a method of fabricating an organic light emitting display having touch sensors in accordance with one embodiment of the present disclosure.

With reference to FIG. 5A, the auxiliary bridges 152a, the first routing layer 156a of each of the first and second routing lines 156 and 186, and the first pad layer 170a of each of the touch driving pads 170 and the touch sensing pads 180 are formed on the substrate 111 provided with the light emitting devices 120 and the encapsulation part 140 formed thereon.

In more detail, a first conductive layer is deposited on the whole surface of the substrate 111 provided with the light emitting devices 120 and the encapsulation part 140 formed thereon through a deposition process. Thereafter, the auxiliary bridges 152a, the first routing layer 156a and the first pad layer 170a are formed by patterning the first conductive layer through a photolithography process using a first mask and an etching process. Here, the first conductive layer is formed to have a monolayer structure or a multilayer structure using metals having high corrosion resistance and high acid resistance, such as Al, Ti, Cu, Mo and MoTi. For example, the first conductive layer has a tri-layer structure, such as Ti/Al/Ti or Mo/Al/Mo.

Figure 5B:
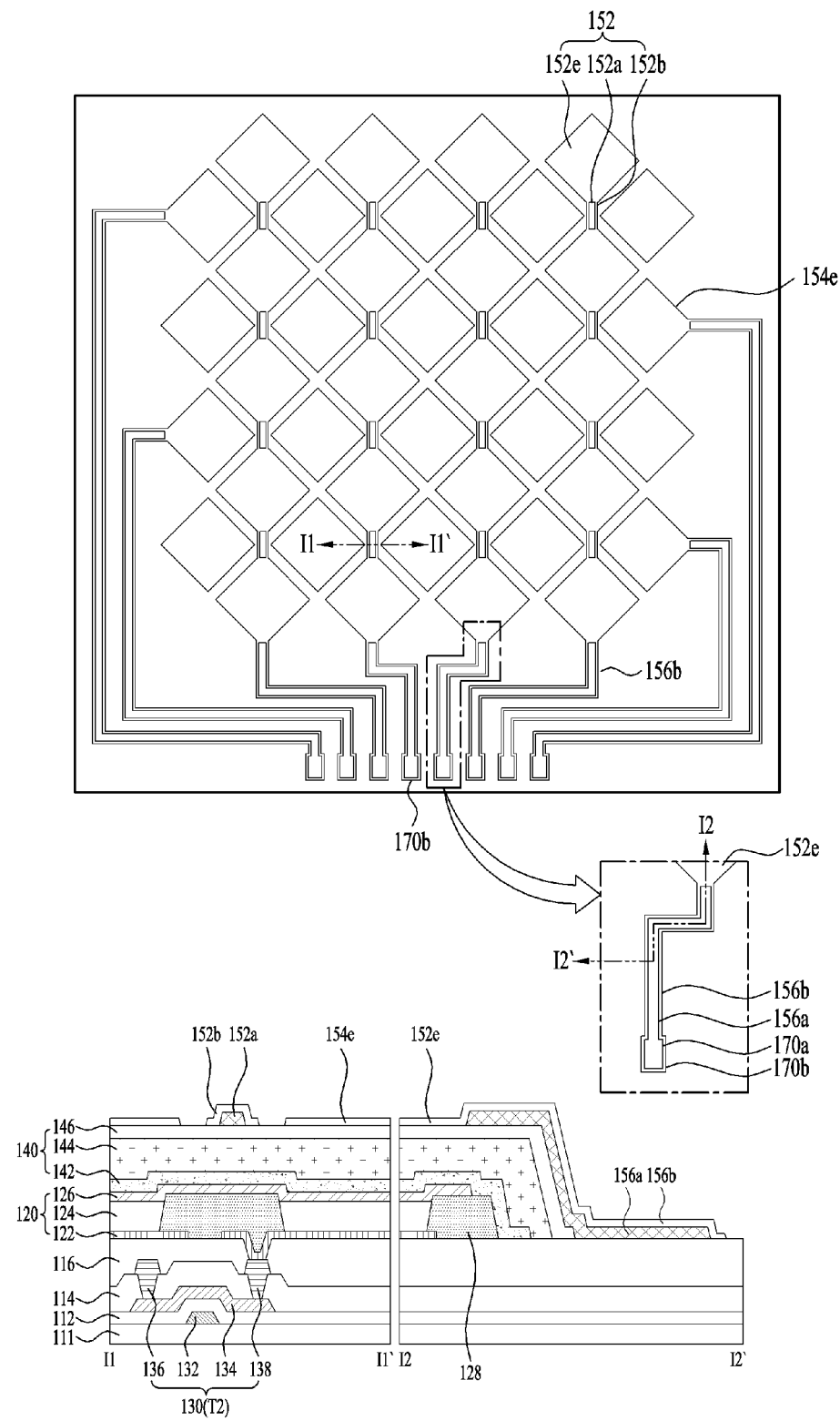

With reference to FIG. 5B, the first bridges 152b, the first and second touch electrodes 152e and 154e, the second routing layer 156b of each of the first and second routing lines 156 and 186 and the second pad layer 170b of the touch driving pads 170 and the touch sensing pads 180 are formed on the substrate 111 provided with the auxiliary bridges 152a, the first routing layer 156a and the first pad layer 170a formed thereon.

In more detail, a second conductive layer is deposited on the whole surface of the substrate 111 provided with the auxiliary bridges 152a, the first routing layer 156a and the first pad layer 170a formed thereon through a deposition process. Thereafter, the first bridges 152b, the first and second touch electrodes 152e and 154e, the second routing layer 156b and the second pad layer 170b are formed by patterning the second conductive layer through a photolithography process using a second mask and an etching process. Here, the second conductive layer employs a transparent conductive film, such as ITO, IZO, ZnO, IGZO or ITO/Ag/ITO, or a conductive polymer.

Figure 5C:
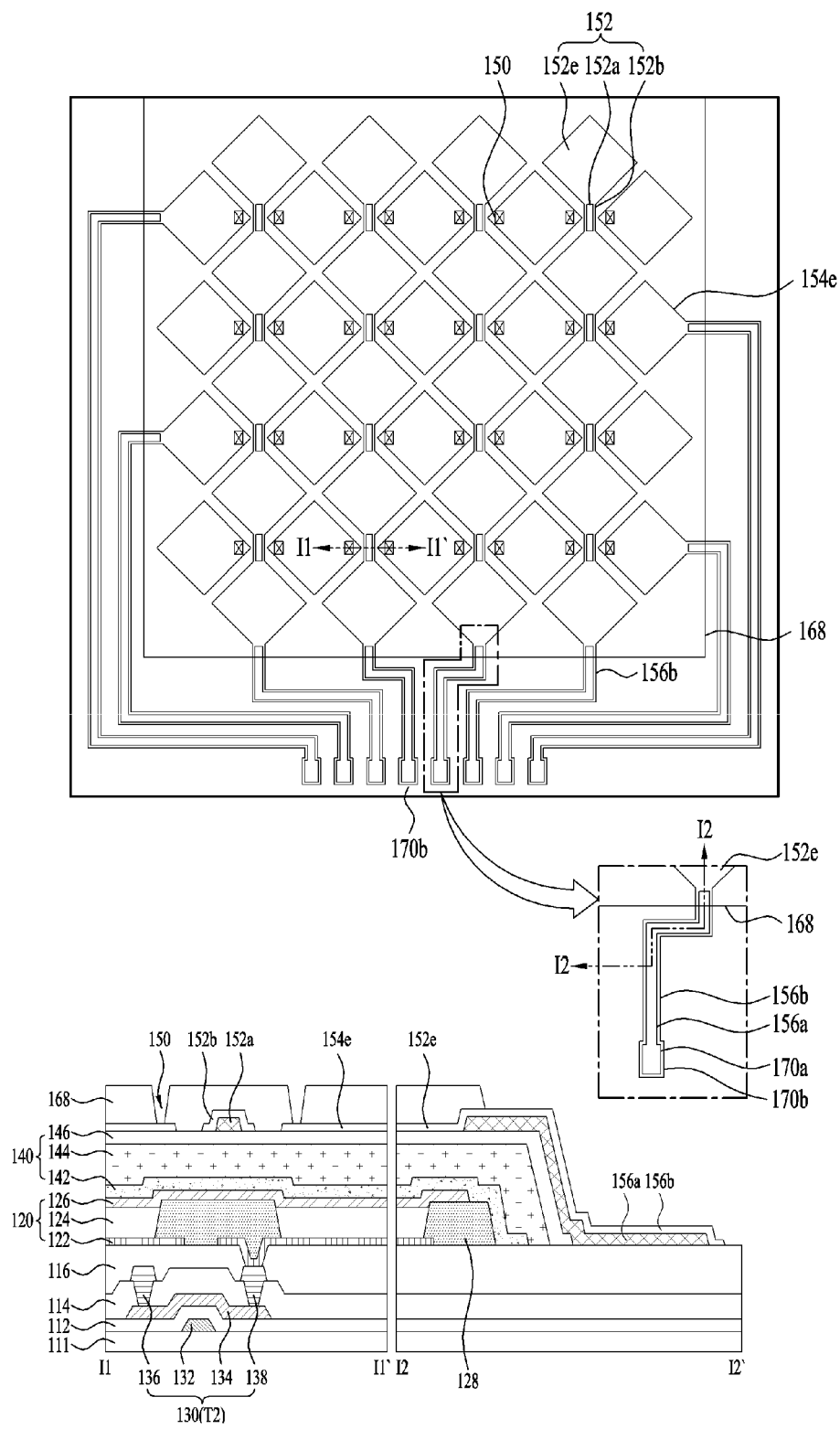

With reference to FIG. 5C, the touch insulating film 168 having the touch contact holes 150 is formed on the substrate 111 provided with the first bridges 152b, the first and second touch electrodes 152e and 154e, the second routing layer 156b and the second pad layer 170b formed thereon.

In more detail, an inorganic or organic insulating material is deposited on the substrate 111 provided with the first bridges 152b, the first and second touch electrodes 152e and 154e, the second routing layer 156b and the second pad layer 170b formed thereon through a deposition process using a metal mask, thereby forming the touch insulating film 168 to expose the second routing layer 156b and the second pad layer 170b. Here, the touch insulating film 168 may be formed by an inorganic film, such as $SiN_x$, SiON or $SiO_2$, silicon oxynitride (or aluminum oxide ($Al_2O_3$), an acrylic-based organic film, an epoxy-based organic film, Parylene-C, Parylene-N, Parylene-F or an siloxane-based organic film. Therefore, the touch contact holes 150 are formed by patterning the touch insulating film 168 through a photolithography process using a third mask and an etching process. The touch contact holes 150 are formed through the touch insulating film 168 and thus expose the second touch electrodes 154e.

Figure 5D:
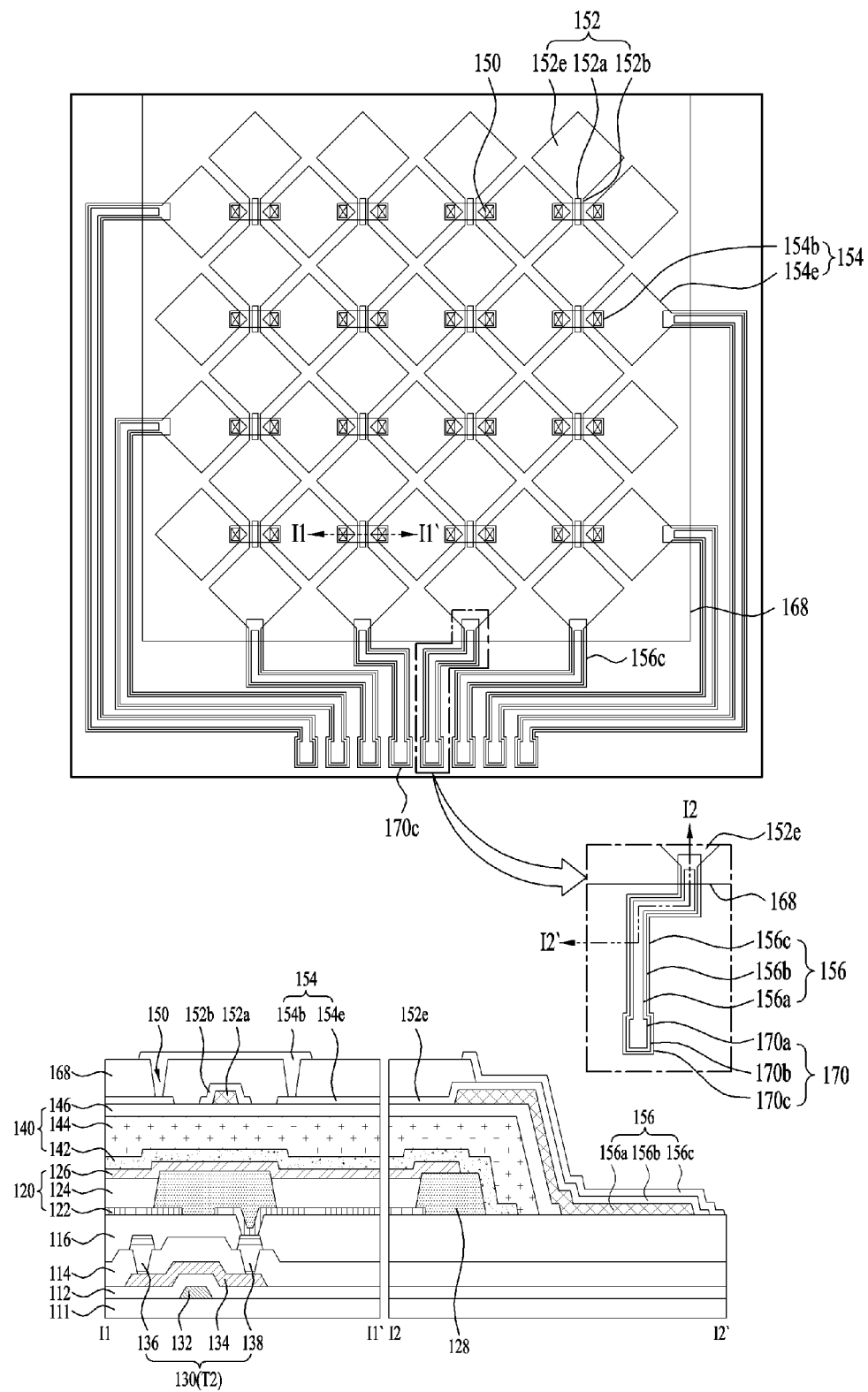

With reference to FIG. 5D, the third routing layer 156c of each of the first and second routing lines 156 and 186, the third pad layer 170c of each of the touch driving pads 170 and the touch sensing pads 180, and the second bridges 154b are formed on the substrate 111 provided with the contact hole 150 formed thereon.

In more detail, a third conductive layer is deposited on the whole surface of the substrate 111 provided with the touch contact holes 150 formed thereon through a deposition process. Thereafter, the third routing layer 156c, the third pad layer 170c and the second bridges 154b are formed by patterning the third conductive layer through a photolithography process using a fourth mask and an etching process. Here, the third conductive layer employs a transparent conductive film, such as ITO, IZO, ZnO, IGZO or ITO/Ag/ITO, or a conductive polymer.

As described above, in this embodiment of the present disclosure, the conductive layers on the encapsulation part 140 form a tri-layer structure and the routing layers included in the routing lines 156 and 186 form a tri-layer structure. In this case, the first to third routing layers 156a, 156b and 156c are respectively formed simultaneously with the first to third conductive layers having the same layer numbers. That is, the auxiliary bridges 152a and the first routing layer 156a formed of the first conductive layer located at a lower layer are simultaneously formed, the first bridges 152b and the second routing layer 156b formed of the second conductive layer located at a middle layer are simultaneously formed, and the second bridges 154b and the third routing layers 156c formed of the third conductive layer located at an upper layer are simultaneously formed.

Figure 6:
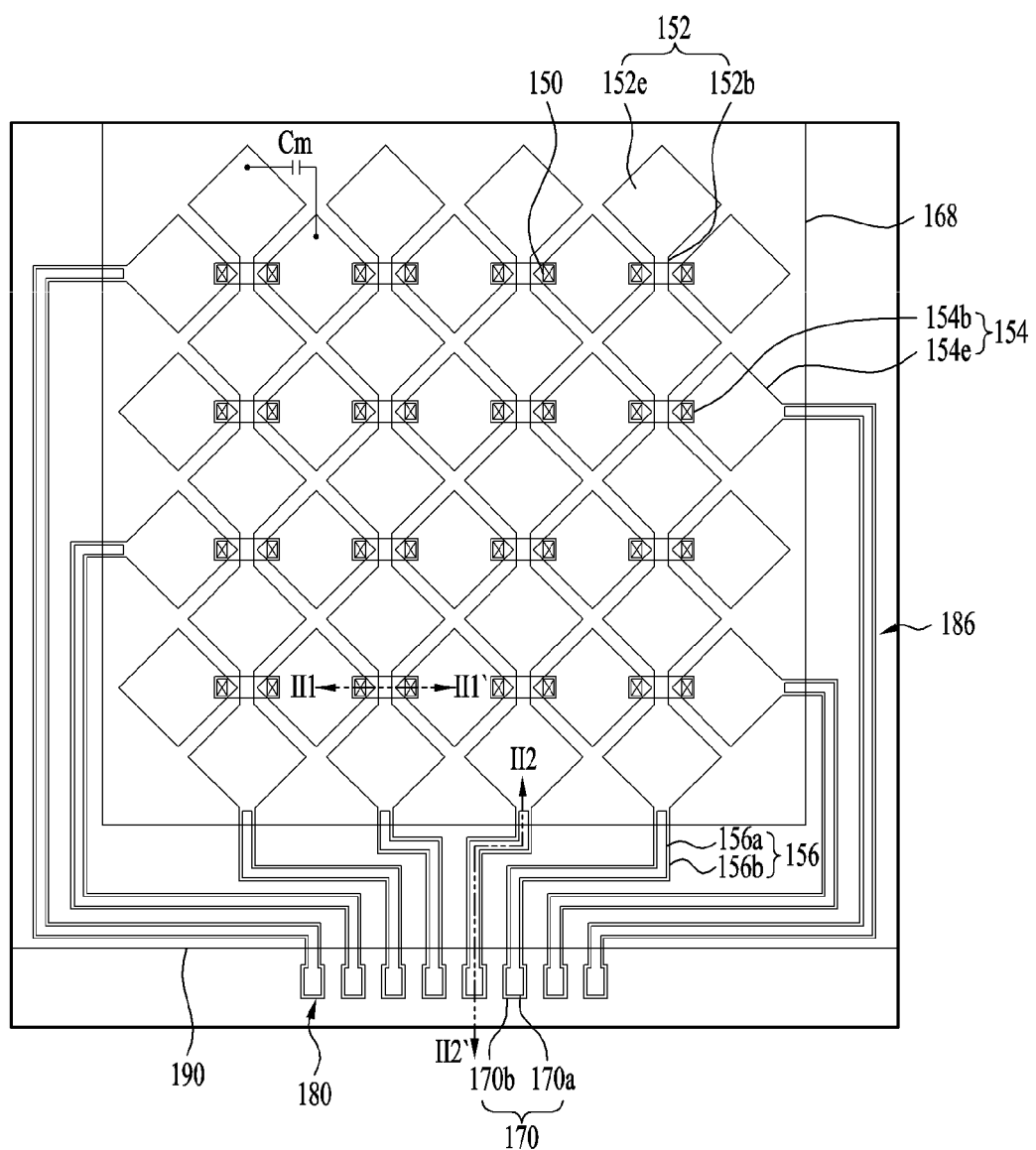
FIG. 6 is a plan view of an organic light emitting display having touch sensors in accordance with a further embodiment of the present disclosure.
Figure 7:
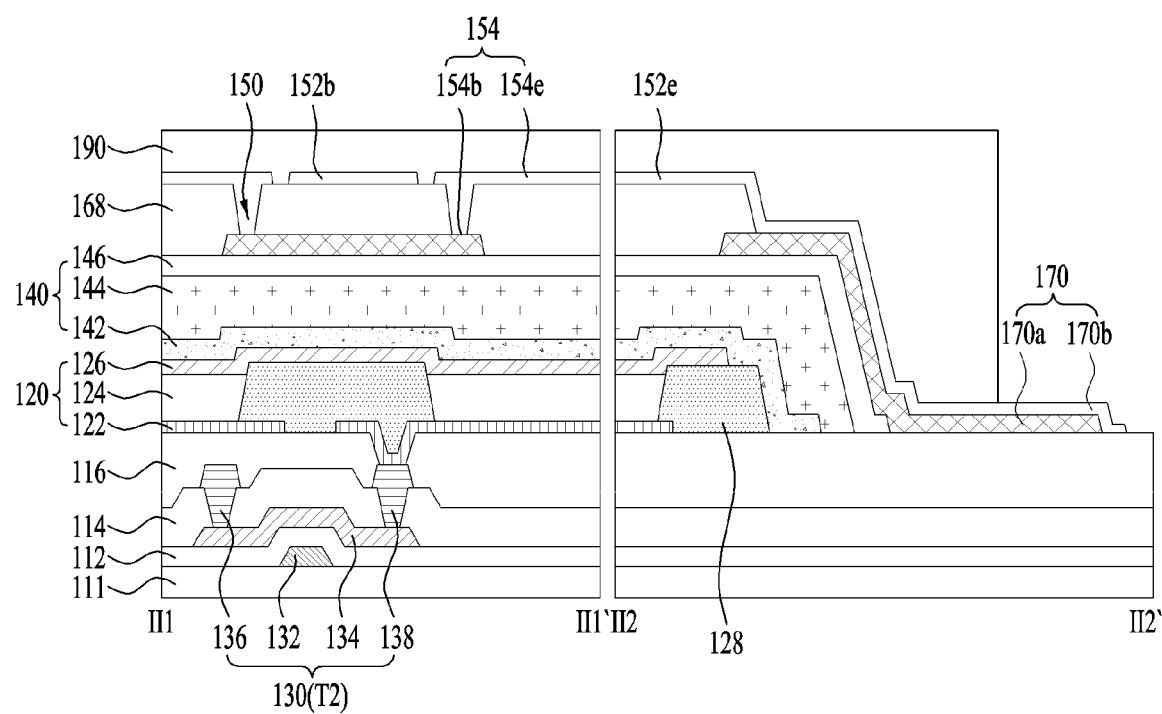
FIG. 7 is a cross-sectional view of the organic light emitting display, taken along lines II1-II1' and II2-II2' of FIG. 6 in accordance with one embodiment of the present disclosure.

FIG. 6 is a plan view of an organic light emitting display having touch sensors in accordance with a further embodiment of the present disclosure, and FIG. 7 is a cross-sectional view of the organic light emitting display, taken along lines II1-II1' and II2-II2' of FIG. 6.

The organic light emitting display shown in FIGS. 6 and 7 is the same as the organic light emitting display shown in FIGS. 2 and 3, except that each of first and second routing lines 156 and 186 is formed by sequentially stacking a first routing layer 156a, i.e., an opaque conductive layer, and a second routing layer 156b, i.e., a transparent conductive layer, and first bridges 152b formed of a transparent conductive layer are stacked on second bridges 154b formed of an opaque conductive layer so as to correspond to the stacking sequence of the first and second routing layers 156a and 156b. Therefore, a detailed description of elements of the organic light emitting display shown in FIGS. 6 and 7, which are substantially the same as those of the organic light emitting display shown in FIGS. 2 and 3, will be omitted because it is considered to be unnecessary.

The second bridges 154b are formed of a first opaque conductive layer on a second inorganic encapsulation layer 146. The second bridges 154b are exposed through touch contact holes 150 formed through a touch insulating film 168 and are conductively connected to second touch electrodes 154e.

The first and second touch electrodes 152e and 154e and the first bridges 152b are formed of a second transparent conductive layer on the touch insulating film 168 located at a higher position than the encapsulation part 140.

Each of the first and second routing lines 156 and 186 is formed by sequentially stacking the first routing layer 156a formed of the first opaque conductive layer and the second routing layer 156b formed of the second transparent conductive layer in the same sequence as the stacking sequence of the first and second conductive layers forming the touch driving lines 152 and the touch sensing lines 154.

Here, the first routing layer 156a is formed of the first opaque conductive layer having a monolayer structure or a multilayer structure using Al, Ti, Cu, Mo and MoTi. The second routing layer 156b extends from each of the first and second touch electrodes 152e and 154e and is formed of the second conductive layer including a transparent conductive film, such as ITO, IZO, ZnO, IGZO or ITO/Ag/ITO, or a conductive polymer.

Figure 8A:
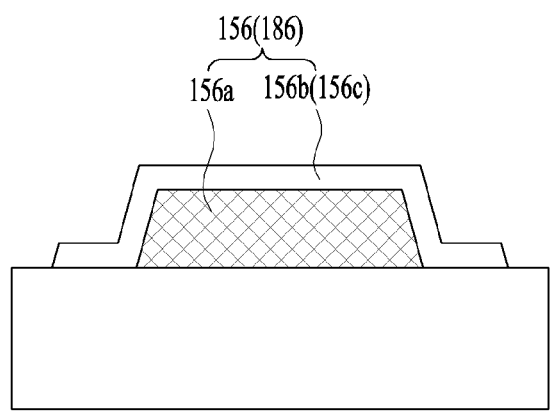
FIGS. 8A and 8B are cross-sectional views illustrating routing lines shown in FIG. 7 in accordance with different embodiments.

If etching characteristics of materials of the first and second routing layers 156a and 156b are the same, the second routing layer 156b is formed on the first routing layer 156a to have a greater line width than that of the first routing layer 156a so as to cover the side and upper surfaces of the first routing layer 156a, as exemplarily shown in FIG. 8A. Therefore, etching of the first routing layer 156a having the same material as the second routing layer 156b by an etching solution or etching gas used in formation of the second routing layer 156b may be prevented.

Figure 8B:
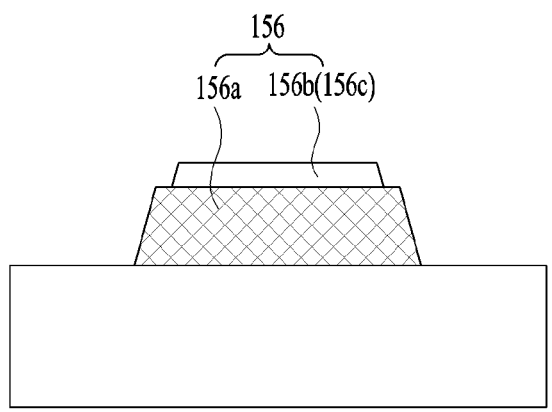
Figure 9A:
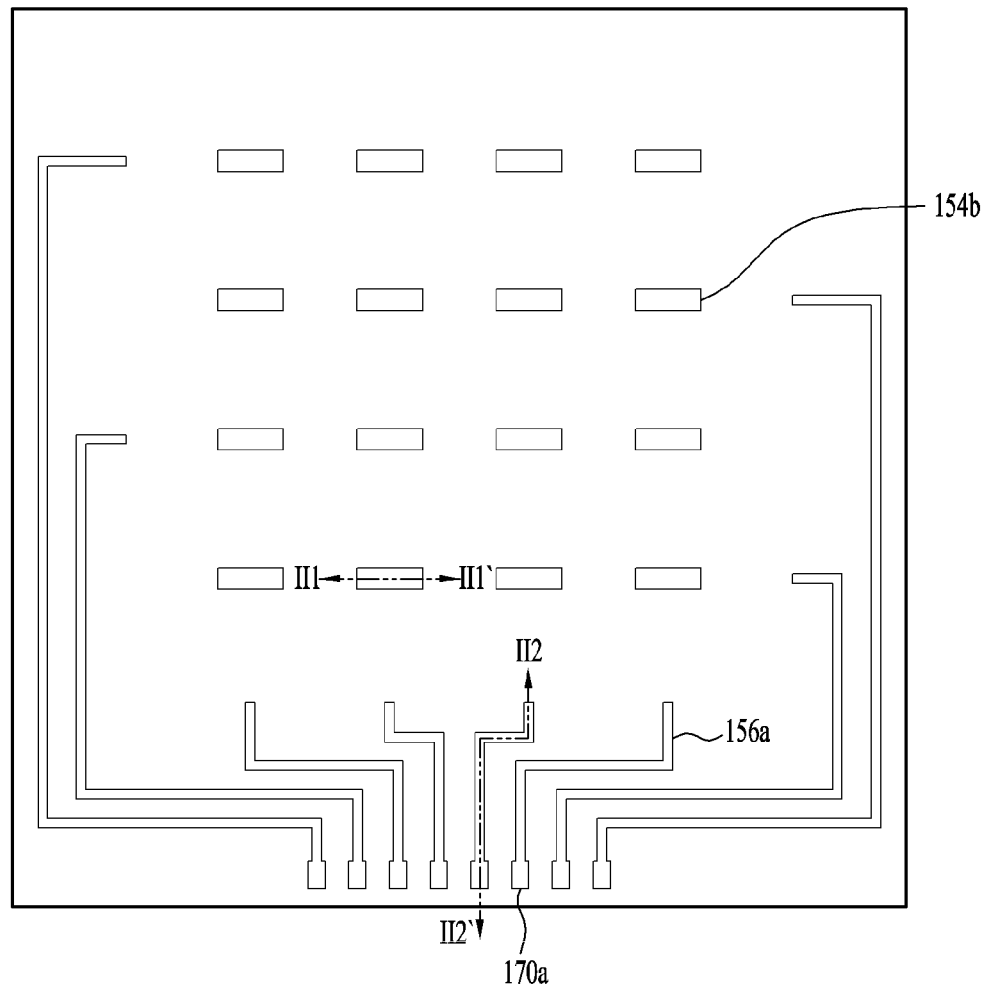
FIGS. 9A to 9D are views illustrating a method of fabricating an organic light emitting display having touch sensors in accordance with a further embodiment of the present disclosure.
Figure 9A:
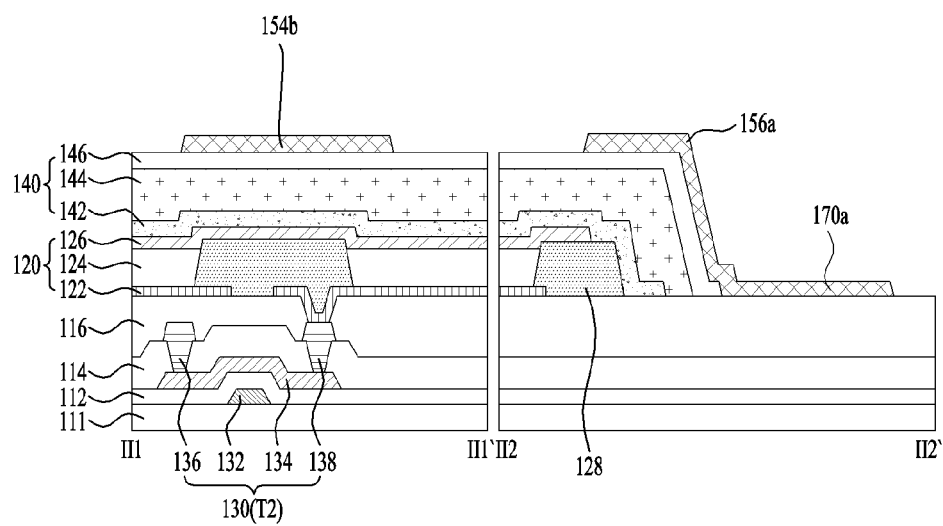
Figure 9B:
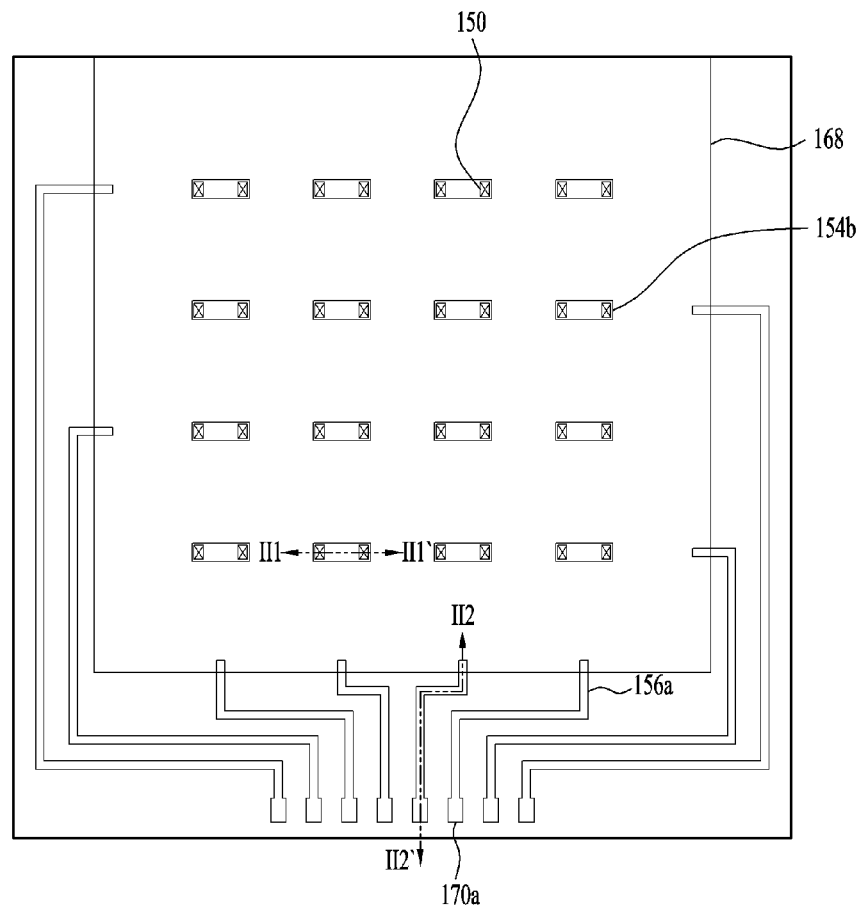
Figure 9B:
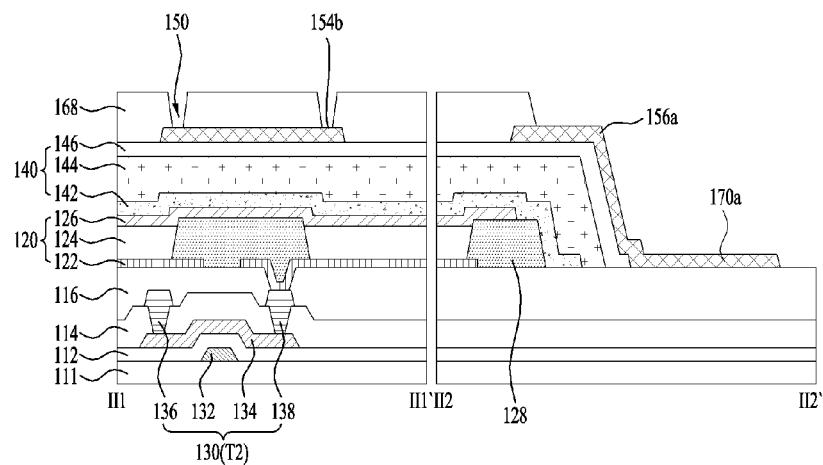
Figure 9C:
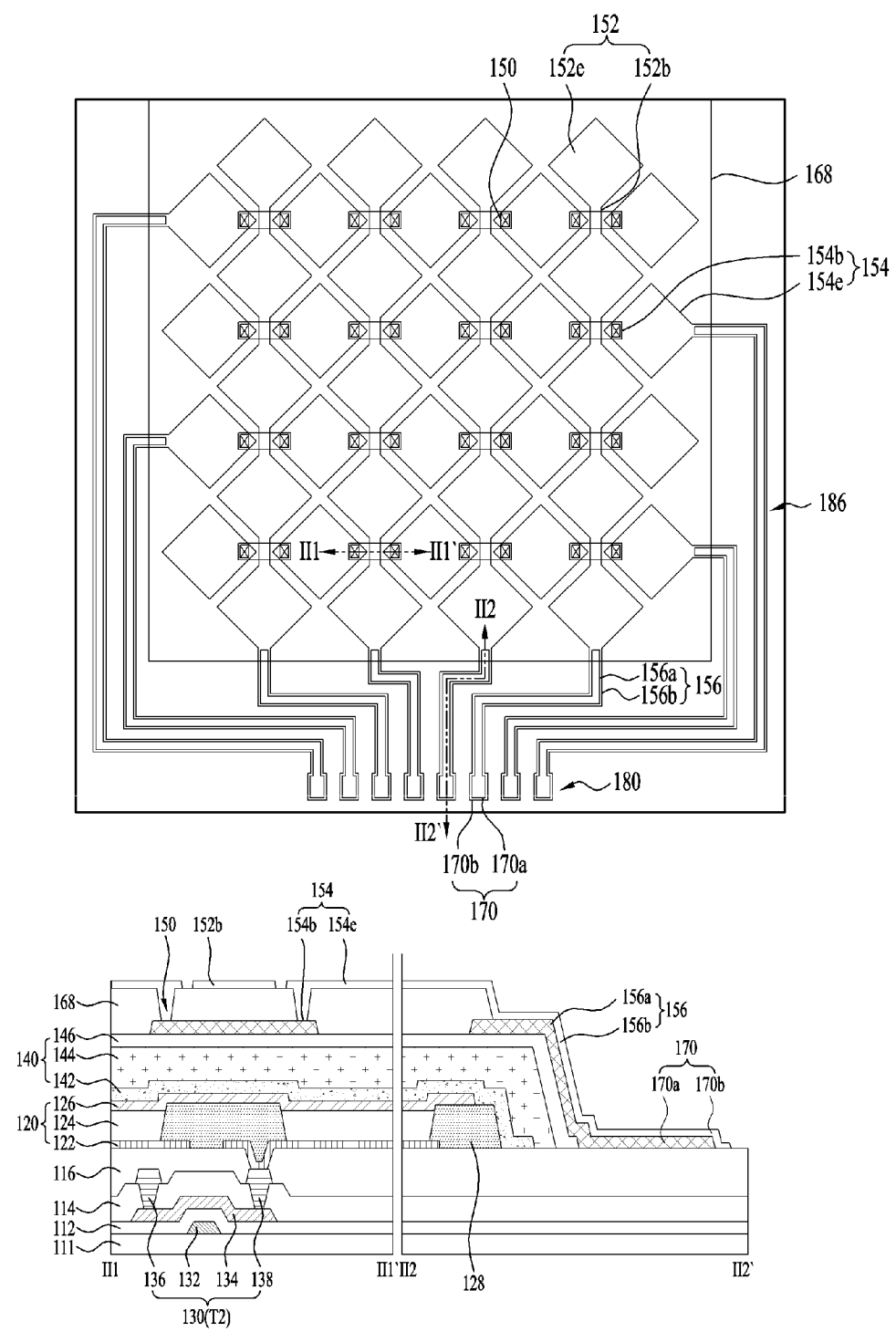
Figure 9D:
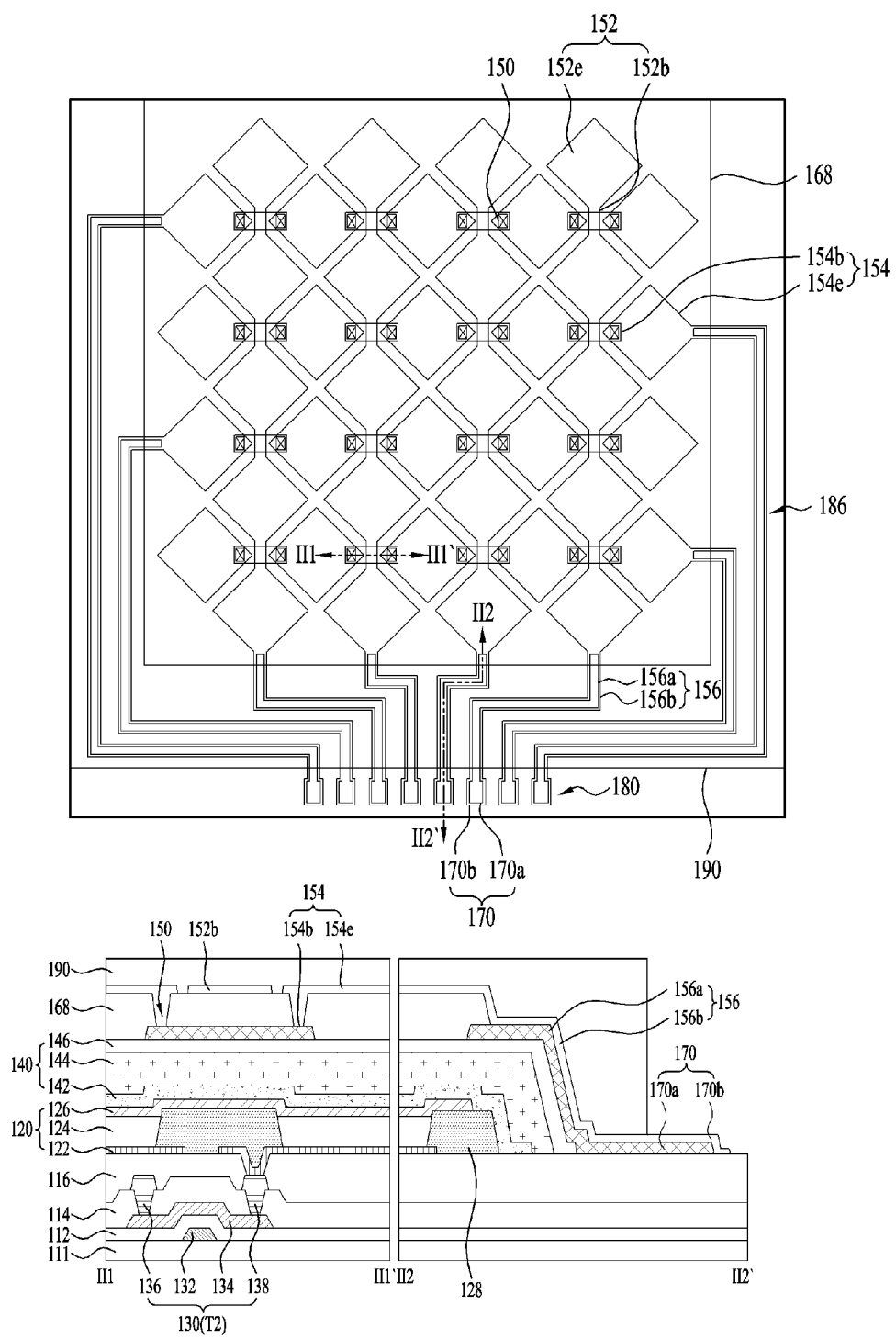

Further, if etching characteristics of materials of the first and second routing layers 156a and 156b are different, the second routing layer 156b is formed on the first routing layer 156a to have a line width which is the same as or different from that of the first routing layer 156a. For example, the second routing layer 156b may be formed on the first routing layer 156a to have a narrower line width than that of the first routing layer 156a, as exemplarily shown in FIG. 8B.

As such, each of the first and second routing lines 156 and 186 is formed to have a multilayer structure and, if a break in any one of a plurality of routing conductive layers included in each of the first and second routing lines 156 and 186 occurs, each of a touch driving pulse and a touch signal is transmitted through the remaining routing conductive layers.

Each of the touch driving pads 170 and the touch sensing pads 180 is formed to have a double-layer structure in the same manner as the first and second routing lines 156 and 186. That is, each of the touch driving pads 170 and the touch sensing pads 180 has a double-layer structure acquired by stacking the first and second pad layers 170a and 170b using the first and second conductive layers. The touch driving pads 170 and touch sensing pads 180 are exposed from a touch protective film 190 and thus contact a signal transmission film on which the touch driving unit is mounted. Here, the touch protective film 190 is formed to cover the touch sensing lines 154 and the touch driving lines 152, thus preventing corrosion of the touch sensing lines 154 and the touch driving lines 152 due to external moisture, etc. Such a touch protective film 190 is formed of an organic insulating material or is formed as a circularly polarizing plate or as an epoxy or acrylic film.

As described above, the organic light emitting display in accordance with this embodiment of the present disclosure includes the first and second routing lines 156 and 186 formed of a plurality of routing layers, stacked in a stacking sequence of the first and second conductive layers included in the touch driving lines 152 and the touch sensing lines 154. The first and second routing lines 156 and 186 have a multilayer structure and, thus, a break of the first and second routing lines 156 and 186 may be prevented. Further, while a touchscreen is attached to a conventional organic light emitting display by an adhesive, in the organic light emitting display in accordance with the present disclosure, the touch electrodes 152e and 154e are directly stacked on the encapsulation part 140 without a separate attachment process and thus the overall fabrication process may be simplified and manufacturing costs may be reduced.

FIGS. 9A to 9D are plan and cross-sectional views illustrating a method of fabricating the organic light emitting display shown in FIGS. 6 and 7.

First, a first conductive layer is deposited on the whole surface of the encapsulation part 140 through a deposition process and, then, the first conductive layer is patterned through a photolithography process using a first mask and an etching process. Thereby, the second bridges 154b, the first routing layer 156a of each of the first and second routing lines 156 and 186 and the first pad layer 170a of each of the touch driving pads 170 and the touch sensing pads 180 are formed on the encapsulation part 140, as exemplarily shown in FIG. 9A. Here, the first conductive layer is formed to have a monolayer structure or a multilayer structure using metals having high corrosion resistance and high acid resistance, such as Al, Ti, Cu, Mo and MoTi. For example, the first conductive layer has a tri-layer structure, such as Ti/Al/Ti or Mo/Al/Mo.

Thereafter, the touch insulating film 168 to expose the second routing layer 156b and the second pad layer 170b is formed by depositing an inorganic or organic insulating material on the substrate 111, provided with the second bridges 154b, the first routing layer 156a and the first pad layer 170a formed thereon, through a deposition process using a metal mask. Thereafter, the touch contact holes 150 are formed by patterning the touch insulating film 168 through a photolithography process using a second mask and an etching process, as exemplarily shown in FIG. 9B.

Thereafter, a second conductive layer is deposited on the whole surface of the substrate 111 provided with the touch insulating film 168 having the touch contact holes 150 formed thereon through a deposition process and, then, the second conductive layer is patterned through a photolithography process using a third mask and an etching process. Thereby, the first bridges 152b, the first and second touch electrodes 152e and 154e, the second routing layer 156b of each of the first and second routing lines 156 and 186, and the second pad layer 170b of each of the touch driving pads 170 and the touch sensing pads 180 are formed on the touch insulating film 168, as exemplarily shown in FIG. 9C. Here, the second conductive layer employs a transparent conductive film, such as ITO, IZO, ZnO, IGZO or ITO/Ag/ITO, or a conductive polymer.

Thereafter, an organic insulating material is applied to the whole surface of the substrate 111 provided with the first bridges 152b, the first and second touch electrodes 152e and 154e, the second routing layer 156b and the second pad layer 170b formed thereon and, then, the organic insulating material is patterned through a photolithography process using a fourth mask and an etching process. Thereby, the touch protective film 190 to expose the second pad layer 170b of each of the touch driving pads 170 and the touch sensing pads 180 is formed, as exemplarily shown in FIG. 9D.

As described above, in this embodiment of the present disclosure, the second bridges 154b and the first routing layer 156a formed of the first conductive layer located at a lower layer are simultaneously formed, and the first bridges 152b and the second routing layer 156b formed of the second conductive layer located at an upper layer are simultaneously formed.

Figure 10:
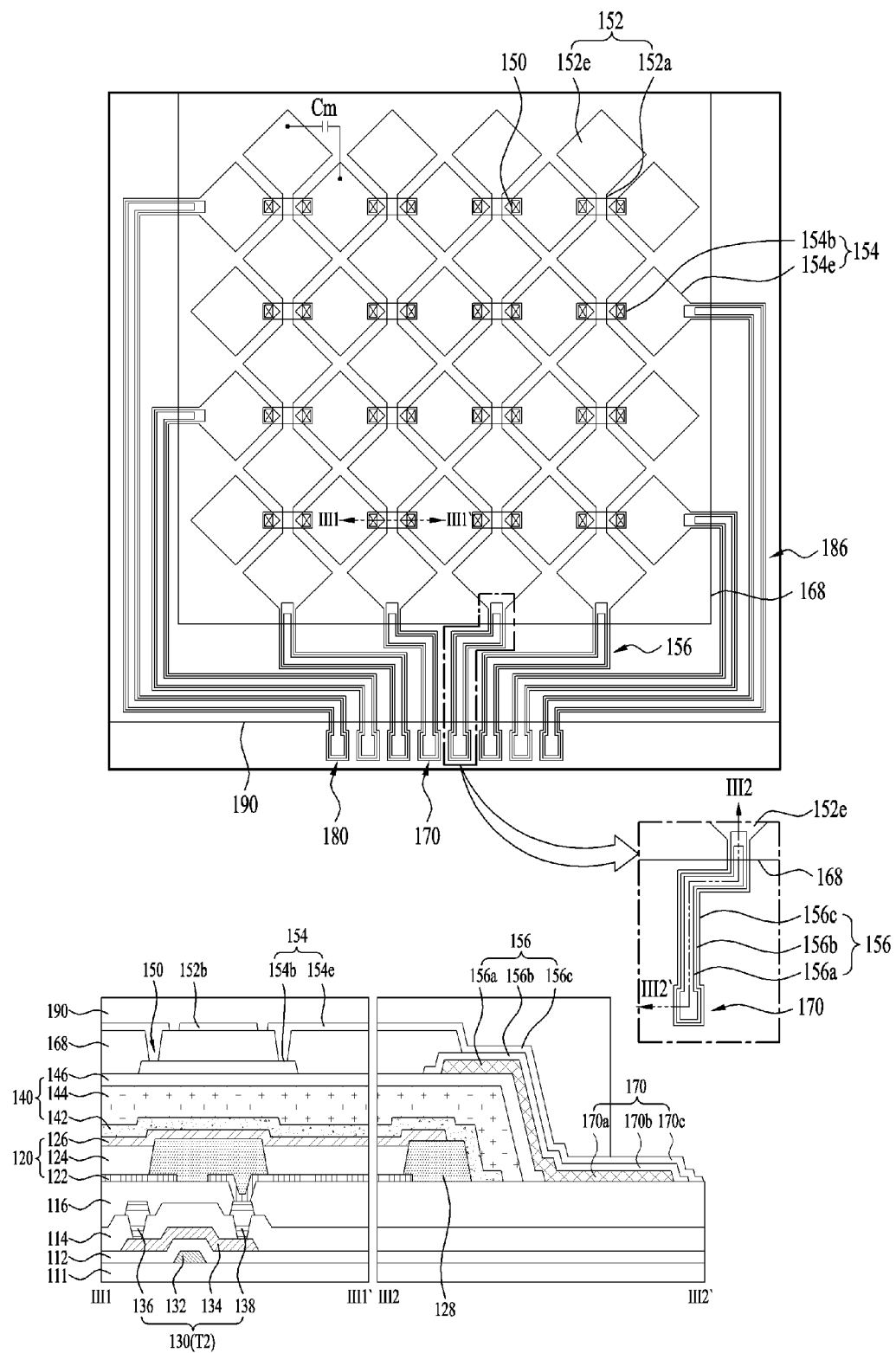
FIG. 10 illustrates plan and cross-sectional views of an organic light emitting display having touch sensors in accordance with another embodiment of the present disclosure.
Figure 11A:
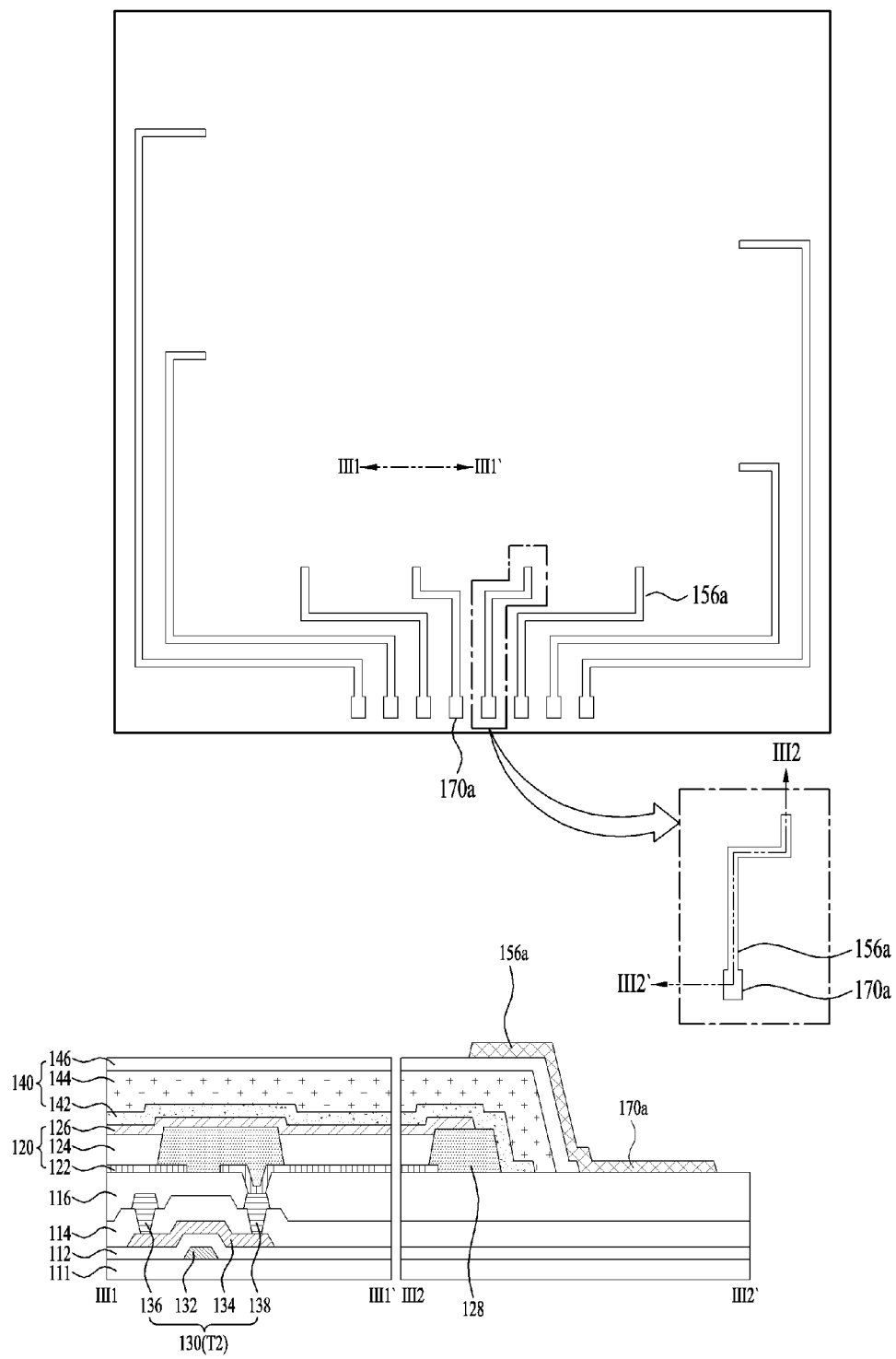
FIGS. 11A to 11E are views illustrating a method of fabricating an organic light emitting display having touch sensors in accordance with another embodiment of the present disclosure.
Figure 11B:
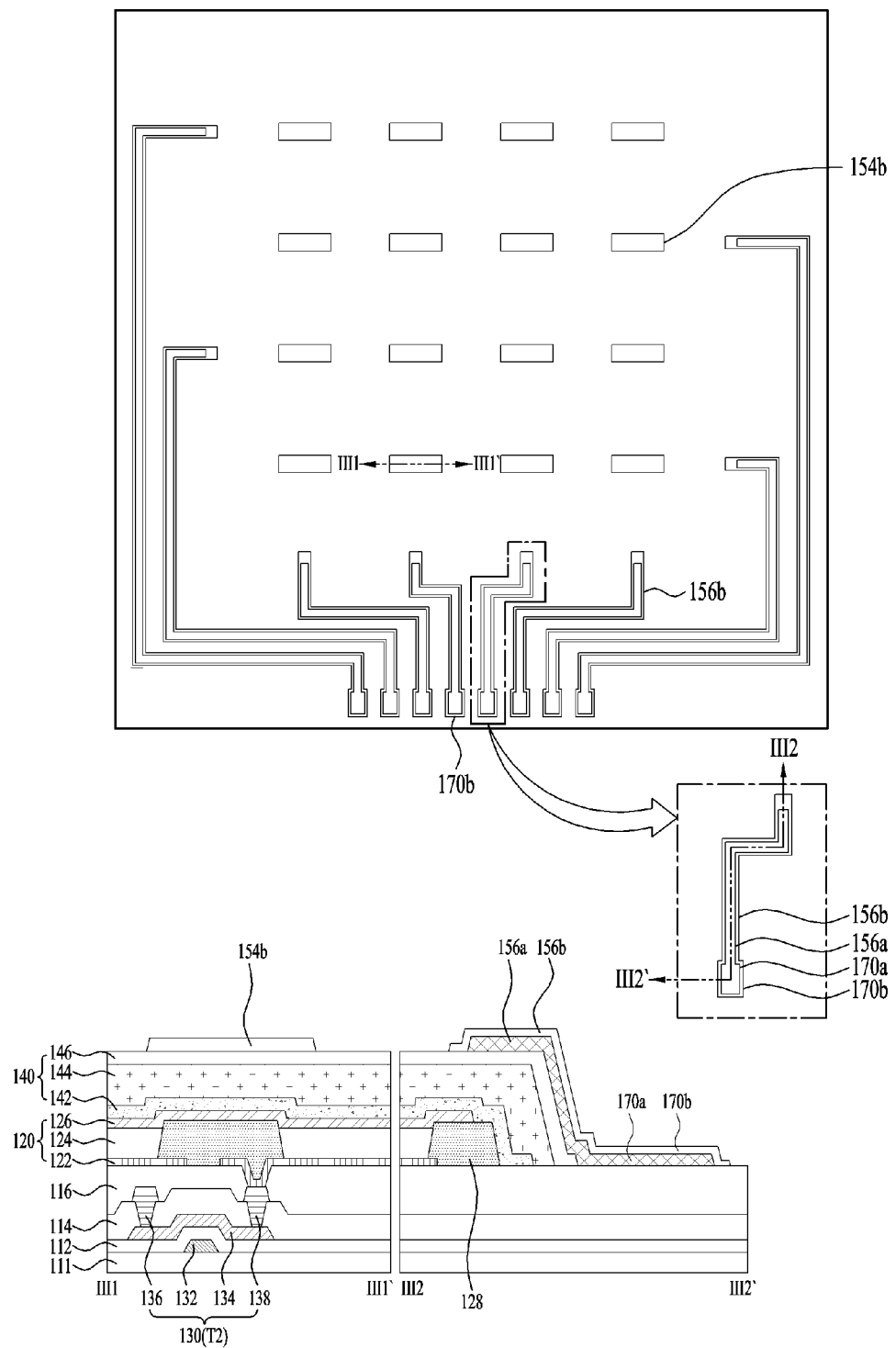
Figure 11C:
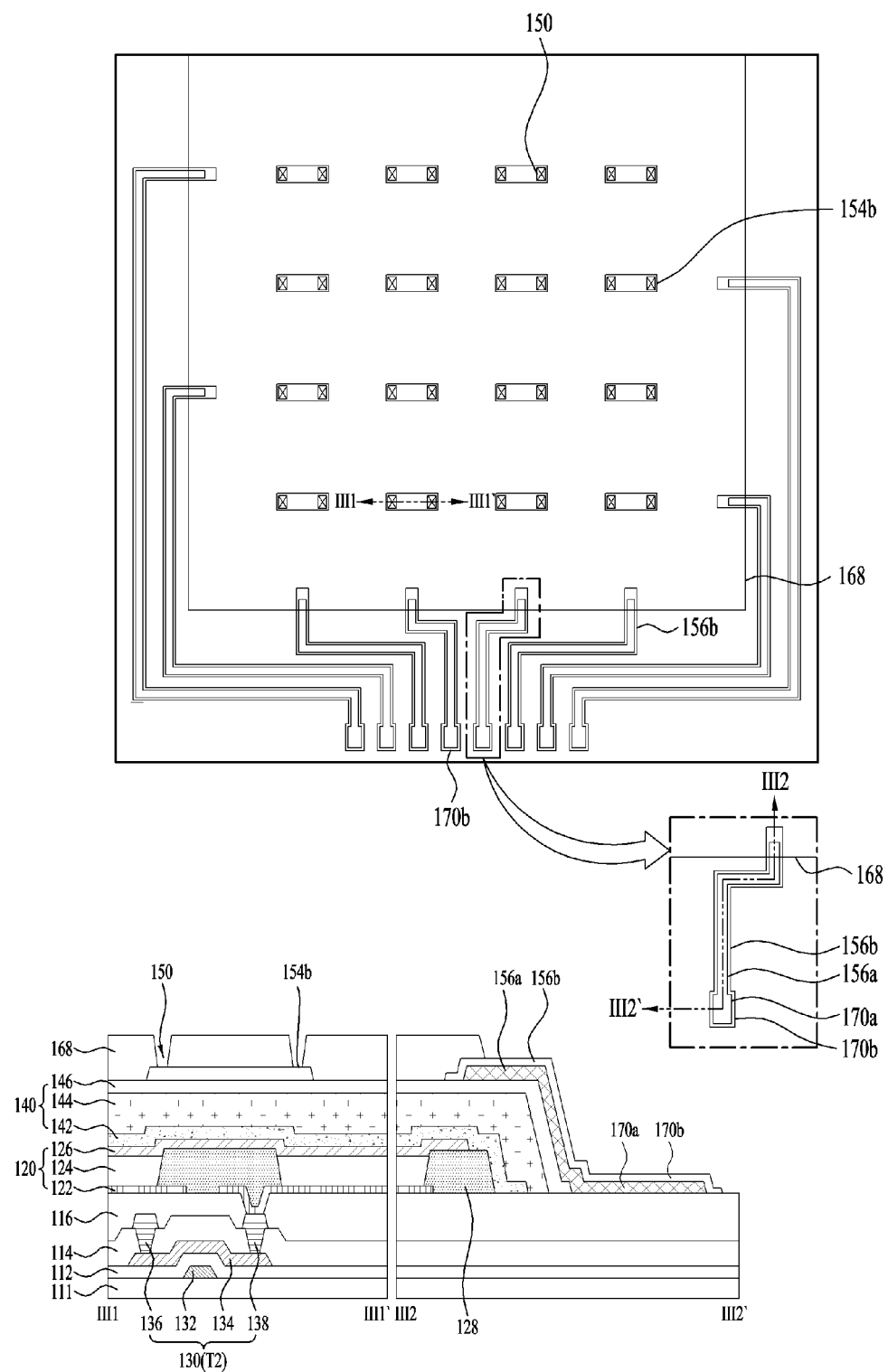
Figure 11D:
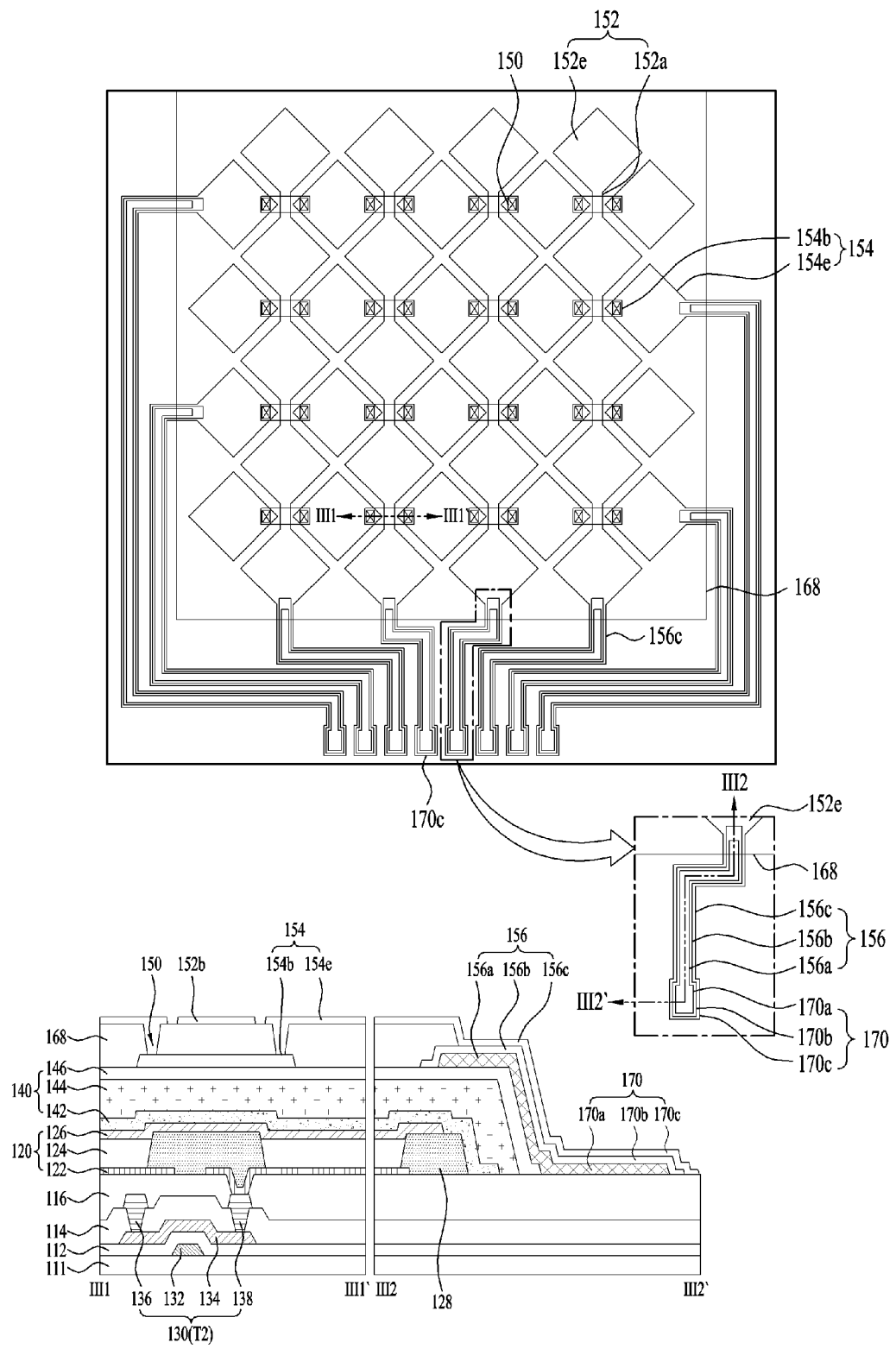
Figure 11E:
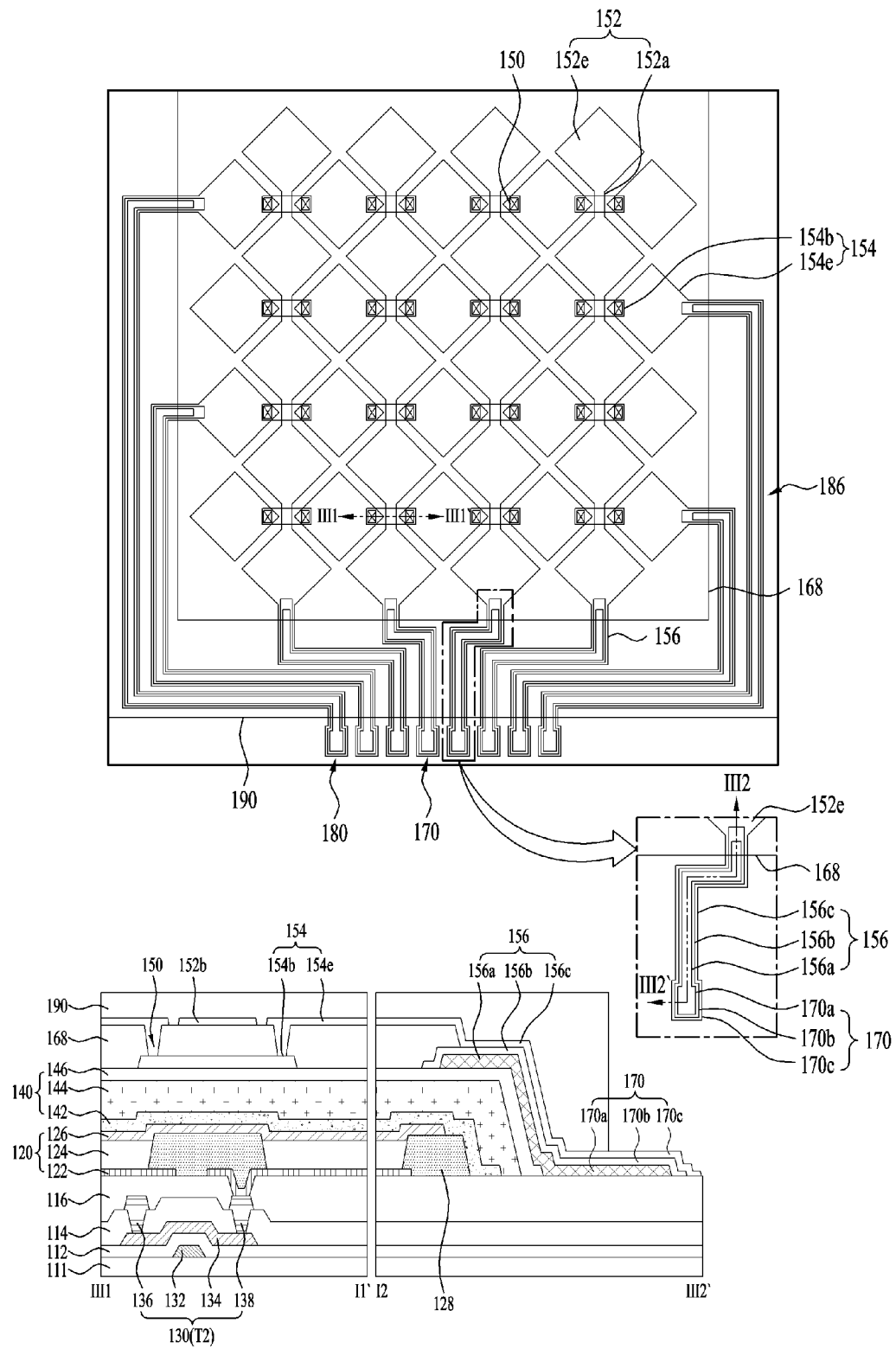

FIG. 10 illustrates plan and cross-sectional views of an organic light emitting display having touch sensors in accordance with another embodiment of the present disclosure.

The organic light emitting display shown in FIG. 10 is the same as the organic light emitting display shown in FIGS. 2 and 3, except that each of first and second routing lines 156 and 186 is formed by sequentially stacking a first routing layer 156a, i.e., an opaque conductive layer, a second routing layer 156b, i.e., a transparent conductive layer, and a third routing layer 156c, i.e., a transparent conductive layer, and first bridges 152b formed of a third transparent conductive layer are stacked on second bridges 154b formed of a second transparent conductive layer so as to correspond to the stacking sequence of the second and third routing layers 156b and 156c. Therefore, a detailed description of elements of the organic light emitting display shown in FIG. 10, which are substantially the same as those of the organic light emitting display shown in FIGS. 2 and 3, will be omitted because it is considered to be unnecessary.

The second bridges 154b are formed of the second transparent conductive layer on an inorganic encapsulation layer 146. The second bridges 154b are exposed through touch contact holes 150 formed through a touch insulating film 168 and are conductively connected to second touch electrodes 154e. The first and second touch electrodes 152e and 154e and the first bridges 152b are formed of the third transparent conductive layer on the touch insulating film 168 located at a higher position than the encapsulation part 140. The first and second bridges 152b and 154b are formed of transparent conductive layers and may thus improve light transmittance.

The second and third transparent routing layers 156b and 156c included in each of the first and second routing lines 156 and 186 are stacked so as to correspond to the stacking sequence of the second and third transparent conductive layers forming the touch driving lines 152 and the touch sensing lines 154. That is, each of the first and second routing lines 156 and 186 is formed by sequentially stacking the first routing layer 156a formed of the first opaque conductive layer, the second routing layer 156b formed of the second transparent conductive layer, and the third routing layer 156c formed of the third transparent conductive layer.

Here, the first routing layer 156a is formed of the first opaque conductive layer having a monolayer structure or a multilayer structure using Al, Ti, Cu, Mo and MoTi. The second routing layer 156b is formed of the second conductive layer including a transparent conductive film, such as ITO, IZO, ZnO, IGZO or ITO/Ag/ITO, or a conductive polymer. The third routing layer 156c extends from each of the first and second touch electrodes 152e and 154e and is formed of the third conductive layer including a transparent conductive film, such as ITO, IZO, ZnO, IGZO or ITO/Ag/ITO, or a conductive polymer.

The laminated cross-section of the first and second routing lines 156 and 186 are the same as those shown in FIGS. 4A to 4C and a detailed description thereof will thus be omitted.

As such, each of the first and second routing lines 156 and 186 is formed to have a multilayer structure and, if a break in any one of a plurality of routing conductive layers included in each of the first and second routing lines 156 and 186 occurs, each of a touch driving pulse and a touch signal is transmitted through the remaining routing conductive layers.

Each of the touch driving pads 170 and the touch sensing pads 180 is formed to have a tri-layer structure in the same manner as the first and second routing lines 156 and 186. That is, each of the touch driving pads 170 and the touch sensing pads 180 has a tri-layer structure acquired by stacking the first to third pad layers 170a, 170b and 170c using the first to third conductive layers.

As described above, the organic light emitting display in accordance with this embodiment of the present disclosure includes the first and second routing lines 156 and 186 having a multilayer structure, thus preventing a break of the first and second routing lines 156 and 186. Further, while a touchscreen is attached to a conventional organic light emitting display by an adhesive, in the organic light emitting display in accordance with the present disclosure, the touch electrodes 152e and 154e are directly stacked on the encapsulation part 140 without a separate attachment process and thus the overall fabrication process may be simplified and manufacturing costs may be reduced.

FIGS. 11A to 11E are plan and cross-sectional views illustrating a method of fabricating the organic light emitting display shown in FIG. 10.

First, a first conductive layer is deposited on the whole surface of the encapsulation part 140 through a deposition process and, then, the first conductive layer is patterned through a photolithography process using a first mask and an etching process. Thereby, the first routing layer 156a of each of the first and second routing lines 156 and 186 and the first pad layer 170a of each of the touch driving pads 170 and the touch sensing pads 180 are formed on the encapsulation part 140, as exemplarily shown in FIG. 11A. Here, the first conductive layer is formed to have a monolayer structure or a multilayer structure using metals having high corrosion resistance and high acid resistance, such as Al, Ti, Cu, Mo and MoTi. For example, the first conductive layer has a tri-layer structure, such as Ti/Al/Ti or Mo/Al/Mo.

Thereafter, a second conductive layer is deposited on the whole surface of the substrate 111 provided with the first routing layer 156a and the first pad layer 170a formed thereon through a deposition process and, then, the second conductive layer is patterned through a photolithography process using a second mask and an etching process. Thereby, the second bridges 154b, the second routing layer 156b and the second pad layer 170b are formed, as exemplarily shown in FIG. 11B. Here, the second conductive layer employs a transparent conductive film, such as ITO, IZO, ZnO, IGZO or ITO/Ag/ITO, or a conductive polymer.

Thereafter, the touch insulating film 168 to expose the second routing layer 156b and the second pad layer 170b is formed by depositing an inorganic or organic insulating material on the substrate 111 provided with the second bridges 154b, the second routing layer 156b and the second pad layer 170b formed thereon through a deposition process using a metal mask. Thereafter, the touch contact holes 150 are formed by patterning the touch insulating film 168 through a photolithography process using a third mask and an etching process, as exemplarily shown in FIG. 11C.

Thereafter, a third conductive layer is deposited on the whole surface of the substrate 111 provided with the touch insulating film 168 having the touch contact holes 150 formed thereon through a deposition process and, then, the third conductive layer is patterned through a photolithography process using a fourth mask and an etching process. Thereby, the first bridges 152b, the third routing layer 156b and the third pad layer 170c are formed on the touch insulating film 168, as exemplarily shown in FIG. 11D. Here, the third conductive layer employs a transparent conductive film, such as ITO, IZO, ZnO, IGZO or ITO/Ag/ITO, or a conductive polymer.

Thereafter, an organic insulating material is applied to the whole surface of the substrate 111 provided with the first bridges 152b, the third routing layer 156b and the third pad layer 170c formed thereon and, then, the organic insulating material is patterned through a photolithography process using a fifth mask and an etching process. Thereby, the touch protective film 190 to expose the third pad layer 170c of each of the touch driving pads 170 and the touch sensing pads 180 is formed, as exemplarily shown in FIG. 11E.

As described above, in this embodiment of the present invention, the conductive layers on the encapsulation part 140 form a double-layer structure and the routing layers included in the routing lines 156 and 186 form a tri-layer structure. In this case, each of the second and third conductive layers on the encapsulation part 140 is formed simultaneously as one of the first to third routing layers 156a, 156b and 156c which is formed of the same material as the corresponding conductive layer. That is, the second bridges 154b formed of the second conductive layer are formed simultaneously with the second routing layer 156b, and the first bridges 152b formed of the third conductive layer are formed simultaneously with the third routing layer 156c.

Figure 12:
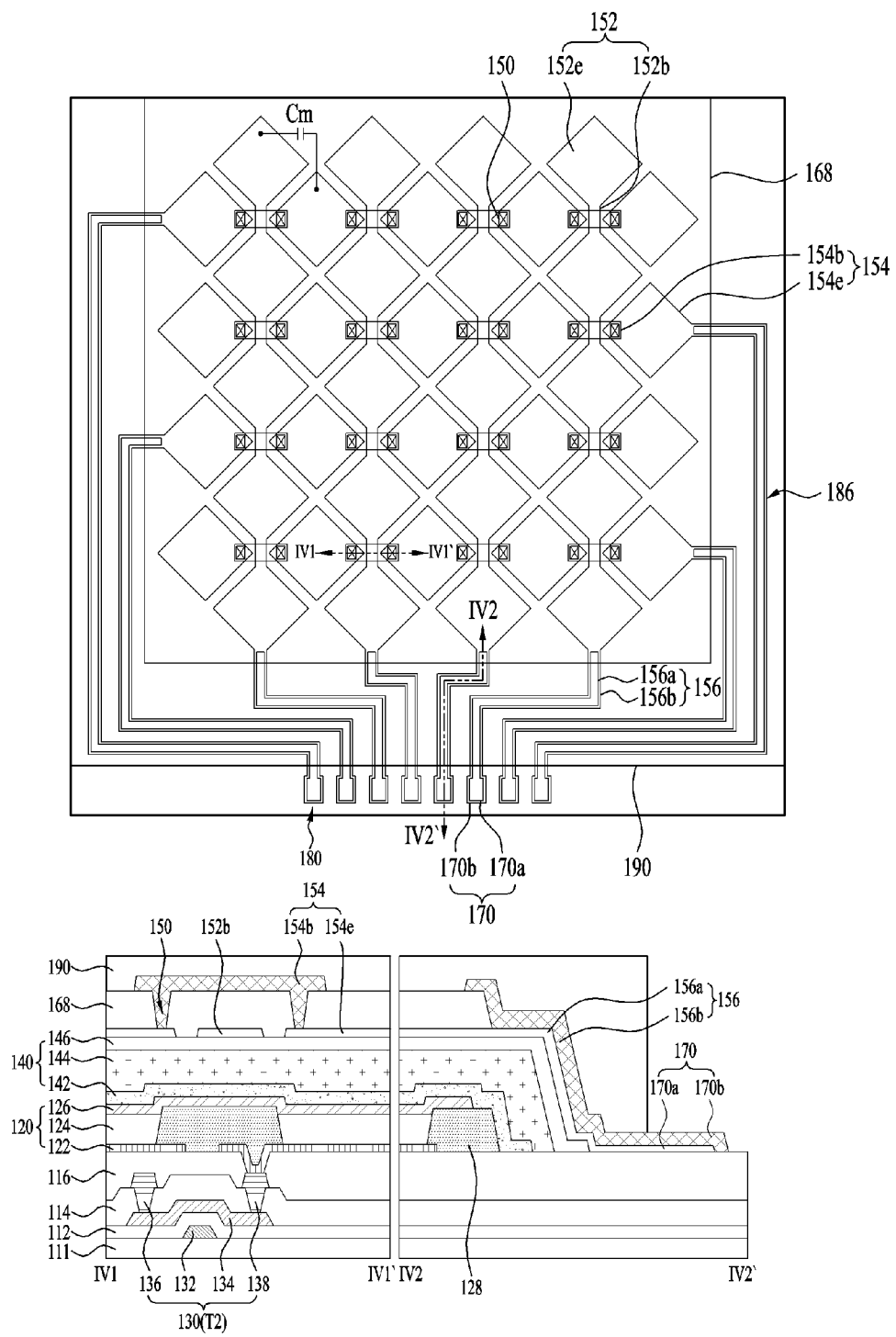
FIG. 12 illustrates plan and cross-sectional views of an organic light emitting display having touch sensors in accordance with another embodiment of the present disclosure.
Figure 13A:
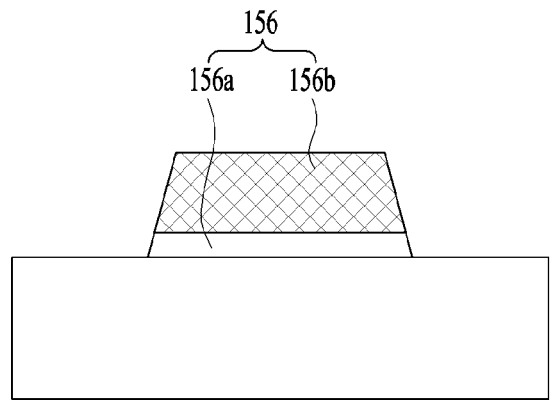
FIGS. 13A to 13C are cross-sectional views illustrating routing lines shown in FIG. 12 in accordance with one embodiment of the present disclosure.
Figure 13B:
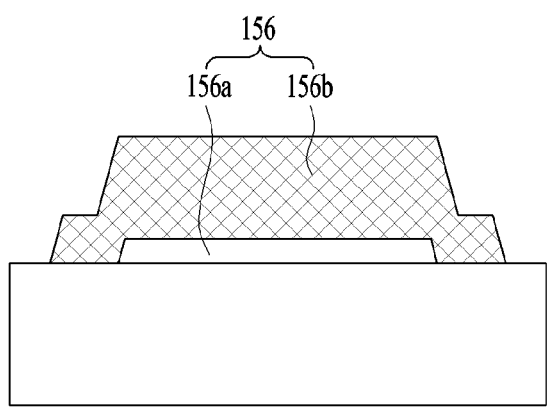
Figure 13C:
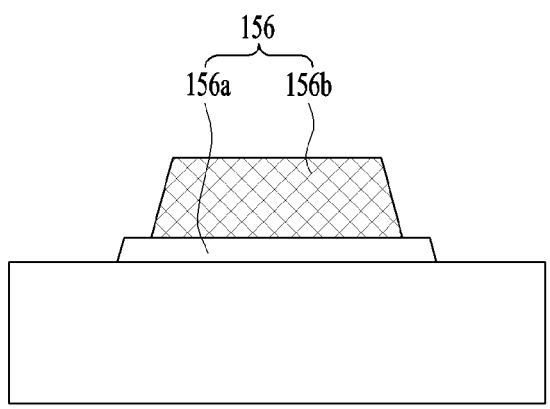
Figure 14A:
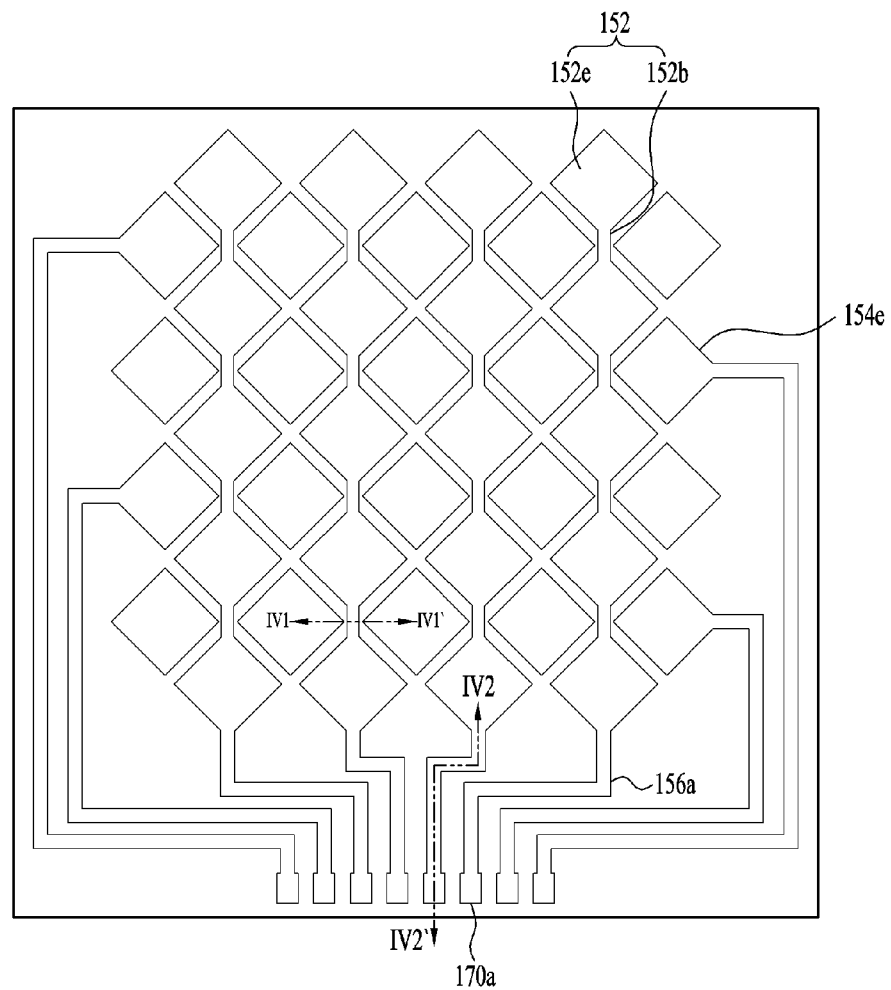
FIGS. 14A to 14D are views illustrating a method of fabricating an organic light emitting display having touch sensors in accordance with another embodiment of the present disclosure.
Figure 14A:
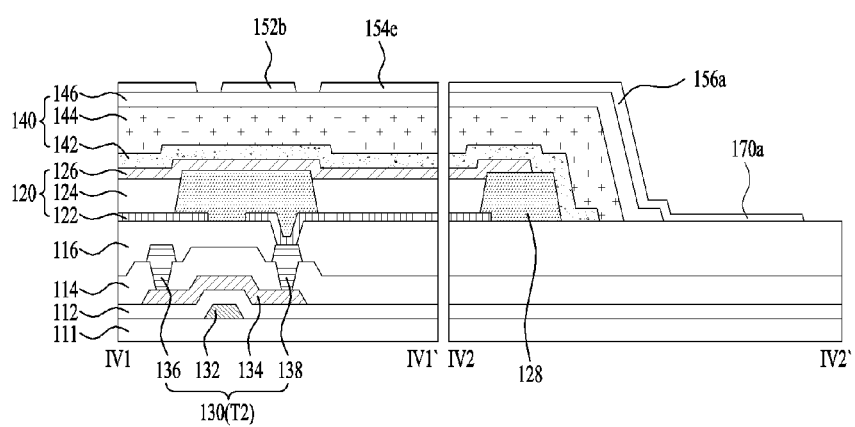
Figure 14B:
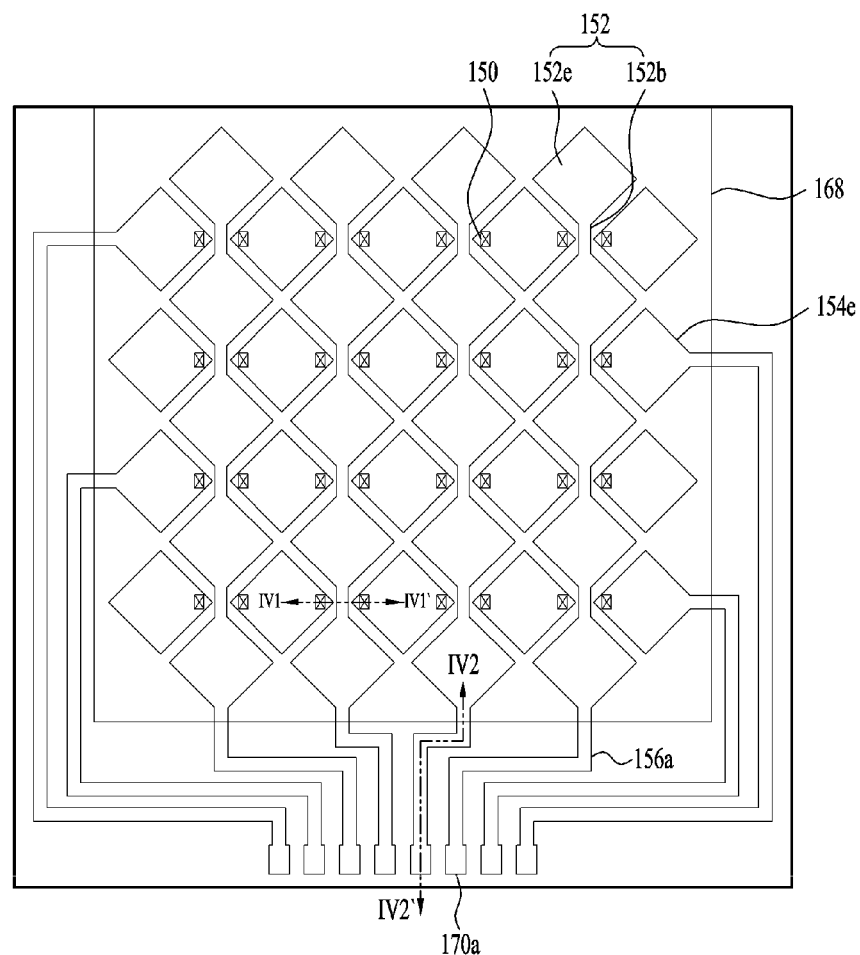
Figure 14B:
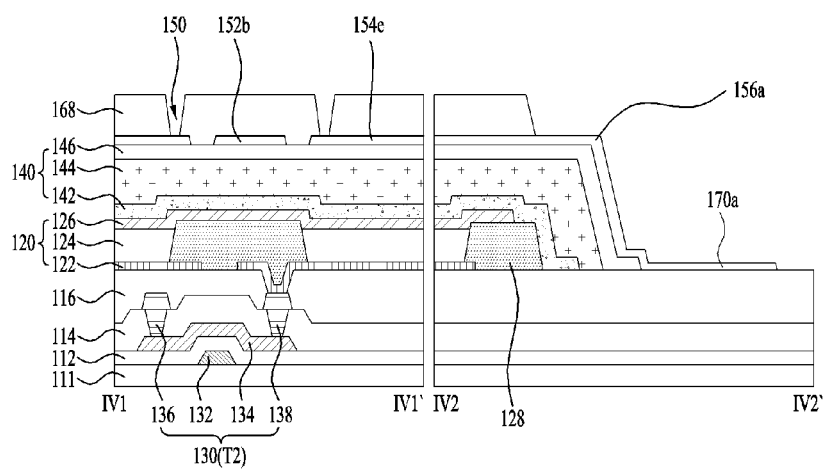
Figure 14C:
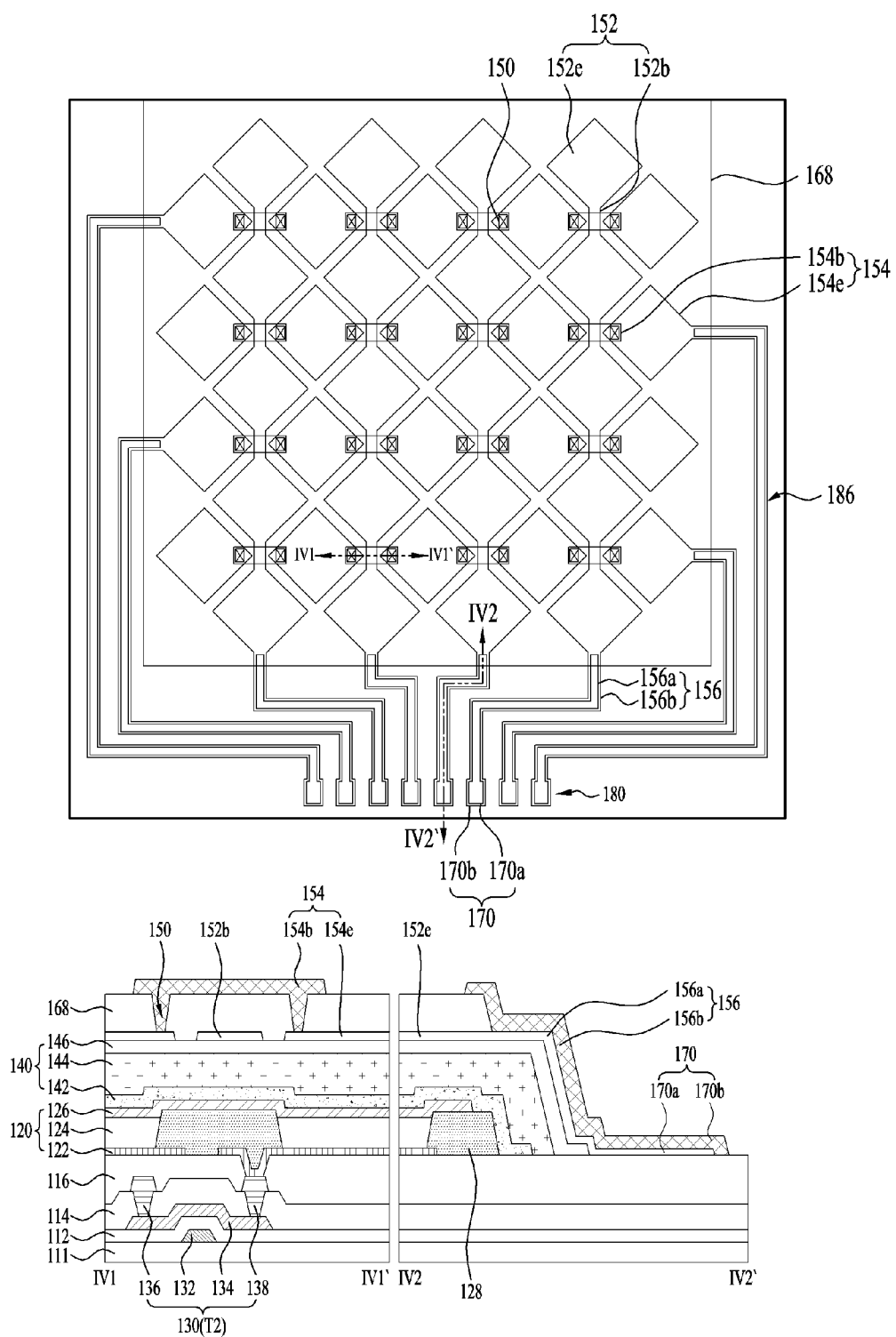
Figure 14D:
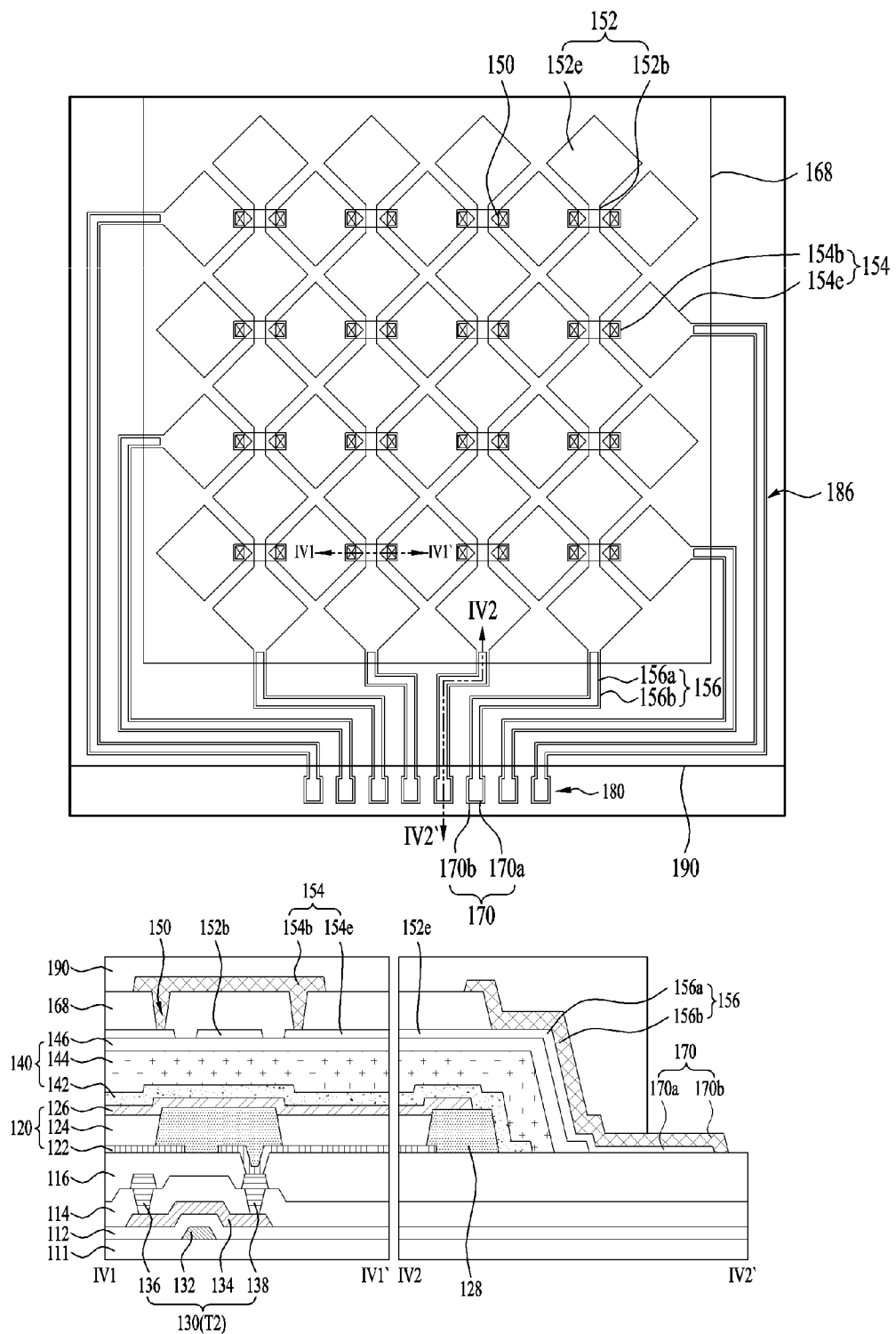

FIG. 12 illustrates plan and cross-sectional views of an organic light emitting display having touch sensors in accordance with another embodiment of the present disclosure, and FIGS. 13A to 13C are cross-sectional views illustrating routing lines shown in FIG. 12.

The organic light emitting display shown in FIG. 12 is the same as the organic light emitting display shown in FIGS. 2 and 3, except that each of first and second routing lines 156 and 186 is formed by sequentially stacking a first routing layer 156a, i.e., a transparent conductive layer, and a second routing layer 156b, i.e., an opaque conductive layer, and second bridges 154b formed of a second opaque conductive layer are stacked on first bridges 152b formed of a first transparent conductive layer so as to correspond to the stacking sequence of the first and second routing lines 156a and 156b. Therefore, a detailed description of elements of the organic light emitting display shown in FIG. 12, which are substantially the same as those of the organic light emitting display shown in FIGS. 2 and 3, will be omitted because it is considered to be unnecessary.

The first bridges 152b and first and second touch electrodes 152e and 154e are formed of the first transparent conductive layer on an inorganic encapsulation layer 146.

The second bridges 154b are formed of the second opaque conductive layer on a touch insulating film 168 located at a higher position than the encapsulation part 140. The second bridges 154b are conductively connected to the second touch electrodes 154e exposed through touch contact holes 150 formed through the touch insulating film 168.

The first transparent routing layer 156a and the second opaque routing layer 156b included in each of the first and second routing lines 156 and 186 are stacked so as to correspond to the stacking sequence of the first transparent conductive layer and the second opaque conductive layer forming the touch driving lines 152 and the touch sensing lines 154. That is, each of the first and second routing lines 156 and 186 is formed by sequentially stacking the first routing layer 156a formed of the first transparent conductive layer and the second routing layer 156b formed of the second opaque conductive layer.

Here, the first routing layer 156a is formed of the first conductive layer including a transparent conductive film, such as ITO, IZO, ZnO, IGZO or ITO/Ag/ITO, or a conductive polymer. The second routing layer 156b extends from each of the first and second touch electrodes 152e and 154e and is formed of the second opaque conductive layer having a monolayer structure or a multilayer structure using Al, Ti, Cu, Mo and MoTi.

If etching characteristics (for example, etching gases or etching solutions) of materials of the first and second routing layers 156a and 156b are the same, the second routing layer 156b is formed on the first routing layer 156a to have the same line width as that of the first routing layer 156a, as exemplarily shown in FIG. 13A, or is formed on the first routing layer 156a to have a greater line width than that of the first routing layer 156a, as exemplarily shown in FIG. 13B. Therefore, etching of the first routing layer 156a having the same etching characteristics as the second routing layer 156b by an etching solution or etching gas used in formation of the second routing layer 156b may be prevented.

If etching characteristics of materials of the first and second routing layers 156a and 156b are different, the second routing layer 156b is formed on the first routing layer 156a to have a line width which is the same as or different from that of the first routing layer 156a. For example, the second routing layer 156b may be formed on the first routing layer 156a to have a narrower line width than that of the first routing layer 156a, as exemplarily shown in FIG. 13C.

As such, each of the first and second routing lines 156 and 186 is formed to have a multilayer structure and, if a break in any one of a plurality of routing conductive layers included in each of the first and second routing lines 156 and 186 occurs, each of a touch driving pulse and a touch signal is transmitted through the remaining routing conductive layers.

Each of the touch driving pads 170 and the touch sensing pads 180 is formed to have a double-layer structure in the same manner as the first and second routing lines 156 and 186. That is, each of the touch driving pads 170 and the touch sensing pads 180 has a double-layer structure acquired by stacking the first and second pad layers 170a and 170b using the first and second conductive layers.

As described above, the organic light emitting display in accordance with this embodiment of the present disclosure includes the first and second routing lines 156 and 186 having a multilayer structure, thus preventing a break of the first and second routing lines 156 and 186. Further, while a touchscreen is attached to a conventional organic light emitting display by an adhesive, in the organic light emitting display in accordance with the present invention, the touch electrodes 152e and 154e are directly stacked on the encapsulation part 140 without a separate attachment process and thus the overall fabrication process may be simplified and manufacturing costs may be reduced.

FIGS. 14A to 14D are views illustrating a method of fabricating the organic light emitting display shown in FIG. 12.

First, a first conductive layer is deposited on the whole surface of the encapsulation part 140 through a deposition process and, then, the first conductive layer is patterned through a photolithography process using a first mask and an etching process. Thereby, the first bridges 152b, the first and second touch electrodes 152e and 154e, the first routing layer 156a and the first pad layer 170a are formed on the encapsulation part 140, as exemplarily shown in FIG. 14A. Here, the first conductive layer employs a transparent conductive film, such as ITO, IZO, ZnO, IGZO or ITO/Ag/ITO, or a conductive polymer.

Thereafter, a touch insulating film 168 to expose the second routing layer 156b and the second pad layer 170b is formed by depositing an inorganic or organic insulating material on the substrate 111 provided with the first bridges 152b, the first and second touch electrodes 152e and 154e, the first routing layer 156a and the first pad layer 170a formed thereon through a deposition process using a metal mask. Thereafter, touch contact holes 150 are formed by patterning the touch insulating film 168 through a photolithography process using a second mask and an etching process, as exemplarily shown in FIG. 14B.

Thereafter, a second conductive layer is deposited on the whole surface of the substrate 111 provided with the touch insulating film 168 having the touch contact holes 150 formed thereon through a deposition process and, then, the second conductive layer is patterned through a photolithography process using a third mask and an etching process. Thereby, the second bridges 154b, the second routing layer 156b and the second pad layer 170b are formed on the touch insulating film 168, as exemplarily shown in FIG. 14C. Here, the second conductive layer is formed to have a monolayer structure or a multilayer structure using metals having high corrosion resistance and high acid resistance, such as Al, Ti, Cu, Mo and MoTi.

Thereafter, an organic insulating material is applied to the whole surface of the substrate 111 provided with the second bridges 154b, the second routing layer 156b and the second pad layer 170b formed thereon and, then, the organic insulating material is patterned through a photolithography process using a fourth mask and an etching process. Thereby, a touch protective film 190 to expose the second pad layer 170b of each of the touch driving pads 170 and the touch sensing pads 180 is formed, as exemplarily shown in FIG. 14D.

As described above, in this embodiment of the present invention, the first bridges 152b and the first routing layer 156a formed of the first conductive layer located at a lower layer are simultaneously formed, and the second bridges 154b and the second routing layer 156b formed of the second conductive layer located at an upper layer are simultaneously formed.

Figure 15:
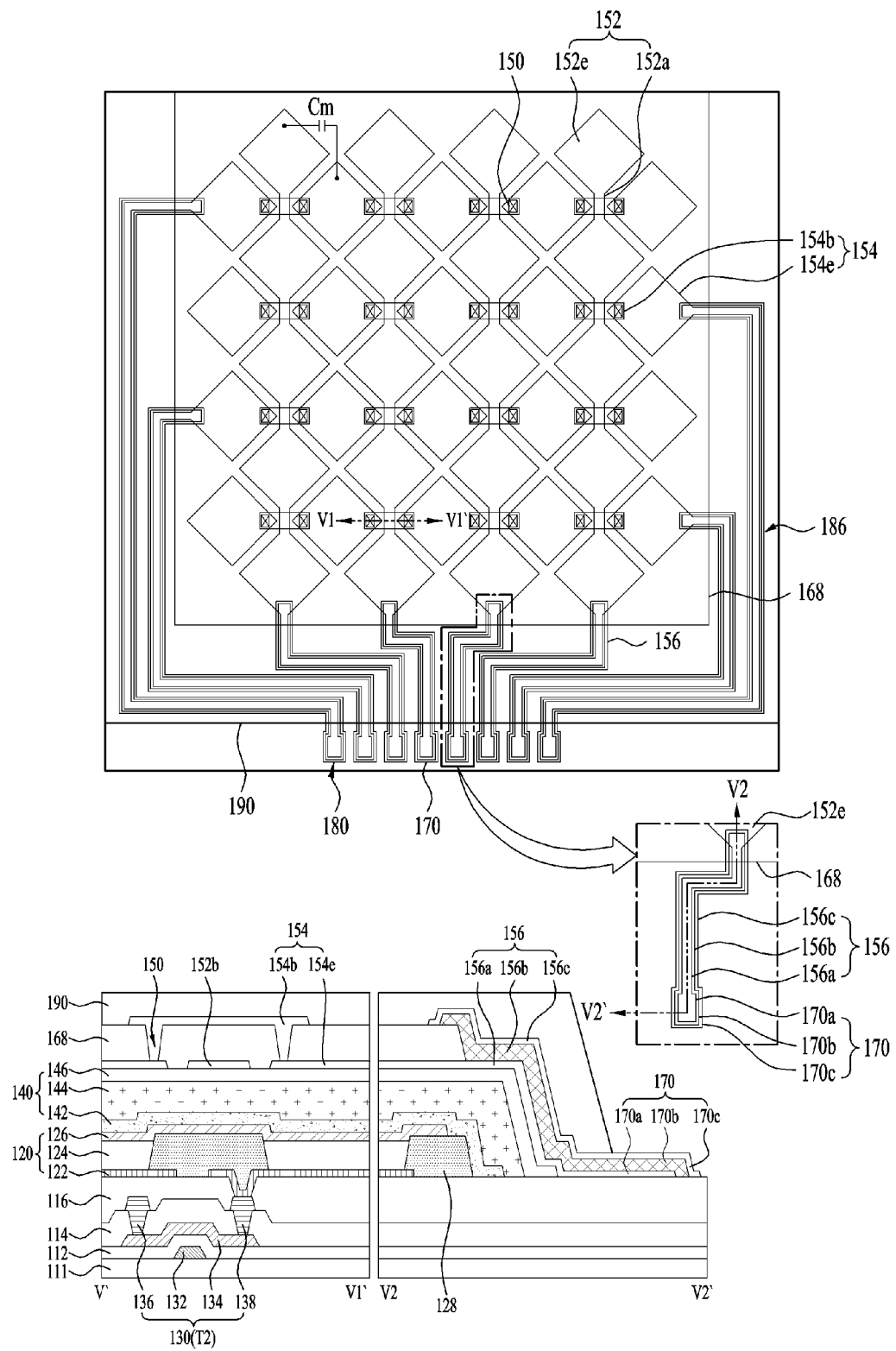
FIG. 15 illustrates plan and cross-sectional views of an organic light emitting display having touch sensors in accordance with yet another embodiment of the present disclosure.

FIG. 15 illustrates plan and cross-sectional views of an organic light emitting display having touch sensors in accordance with yet another embodiment of the present disclosure, and FIGS. 16A to 16D are cross-sectional views illustrating routing lines shown in FIG. 15 in accordance with embodiments.

The organic light emitting display shown in FIG. 15 is the same as the organic light emitting display shown in FIGS. 2 and 3, except that each of first and second routing lines 156 and 186 is formed by sequentially stacking a first routing layer 156a, i.e., a transparent conductive layer, a second routing layer 156b, i.e., an opaque conductive layer, and a third routing layer 156c, i.e., a transparent conductive layer, and second bridges 154b formed of a third transparent conductive layer are stacked on first bridges 152b formed of a first transparent conductive layer so as to correspond to the stacking sequence of the transparent conductive layers of the first and second routing lines 156 and 186. Therefore, a detailed description of elements of the organic light emitting display shown in FIG. 15, which are substantially the same as those of the organic light emitting display shown in FIGS. 2 and 3, will be omitted because it is considered to be unnecessary.

The first bridges 152b and the first and second touch electrodes 152e and 154e are formed of the first transparent conductive layer on an inorganic encapsulation layer 146.

The second bridges 154b are formed of the third transparent conductive layer on a touch insulating film 168 located at a higher position than the encapsulation part 140. The second bridges 154b are exposed through touch contact holes 150 formed through the touch insulating film 168 and conductively connected to the second touch electrodes 154e.

Each of the first and second routing lines 156 and 186 is formed by sequentially stacking the first routing layer 156a formed of the first transparent conductive layer, the second routing layer 156b formed of the second opaque conductive layer, and the third routing layer 156c formed of the third transparent conductive layer.

Here, the first routing layer 156a extends from each of the first and second touch electrodes 152e and 154e, and is formed of the first conductive layer including a transparent conductive film, such as ITO, IZO, ZnO, IGZO or ITO/Ag/ITO, or a conductive polymer. The second routing layer 156b is formed of the second opaque conductive layer having a monolayer structure or a multilayer structure using Al, Ti, Cu, Mo and MoTi. The third routing layer 156c is formed of the third conductive layer including a transparent conductive film, such as ITO, IZO, ZnO, IGZO or ITO/Ag/ITO, or a conductive polymer.

Figure 16A:
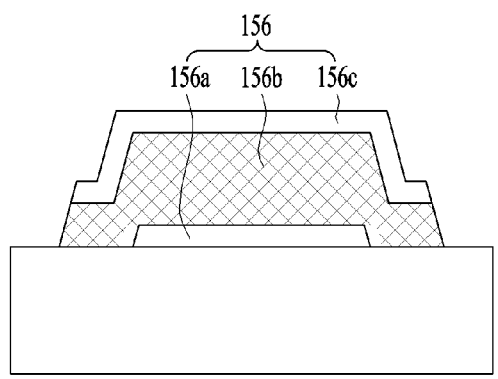
FIGS. 16A to 16D are cross-sectional views illustrating routing lines shown in FIG. 15 in accordance with different embodiments.
Figure 16B:
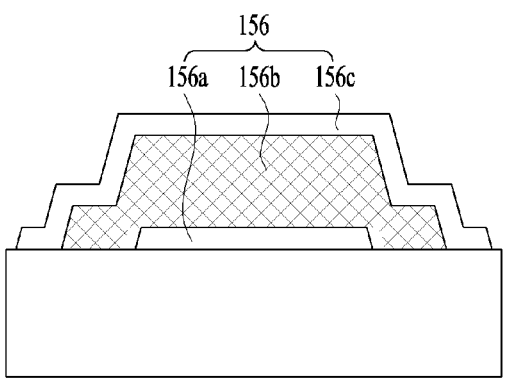

If etching characteristics (for example, etching gases or etching solutions) of materials of the second routing layer 156b and third routing layers 156c are the same, the third routing layer 156c is formed on the second routing layer 156b to have the same line width as that of the second routing layer 156b, as exemplarily shown in FIG. 16A, or the third routing layer 156C is formed on the second routing layer 156b to have a greater line width than that of the second routing layer 156b, as exemplarily shown in FIG. 16B. If etching characteristics of materials of the first and second routing layers 156a and 156b are different, the second routing layer 156b is formed on the first routing layer 156a to have a line width which is the same as or different from that of the first routing layer 156a. For example, the second routing layer 156b may be formed on the first routing layer 156a to have a narrower line width than that of the first routing layer 156a, as exemplarily shown in FIGS. 16C and 16D.

Figure 16C:
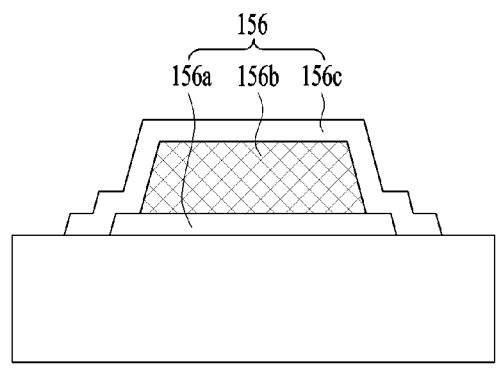
Figure 16D:
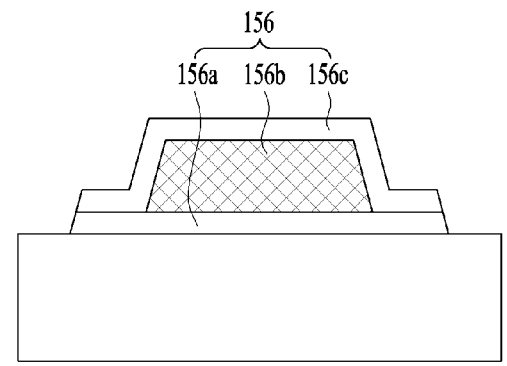
Figure 17A:
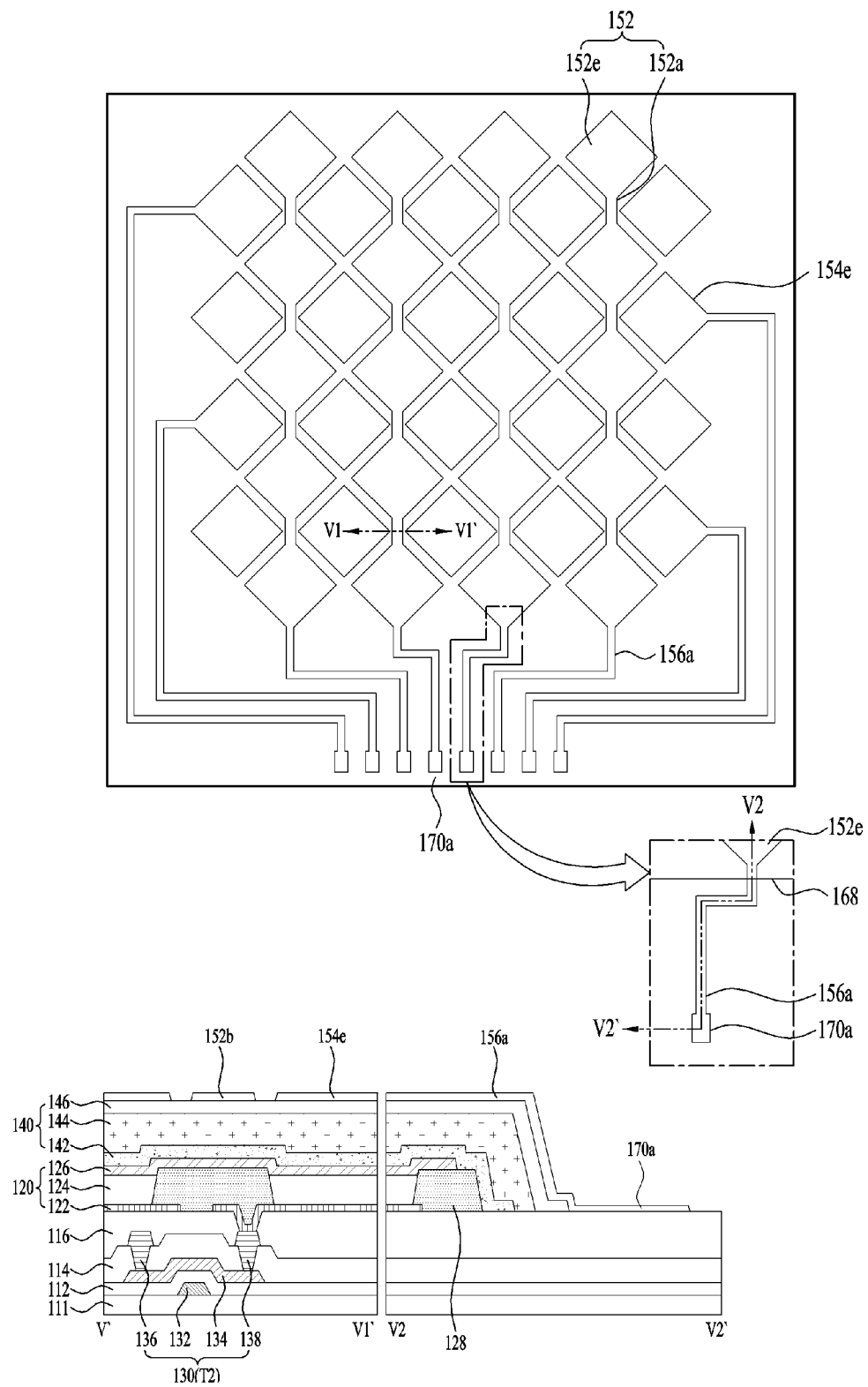
FIGS. 17A to 17E are views illustrating a method of fabricating an organic light emitting display having touch sensors in accordance with yet another embodiment of the present disclosure.
Figure 17B:
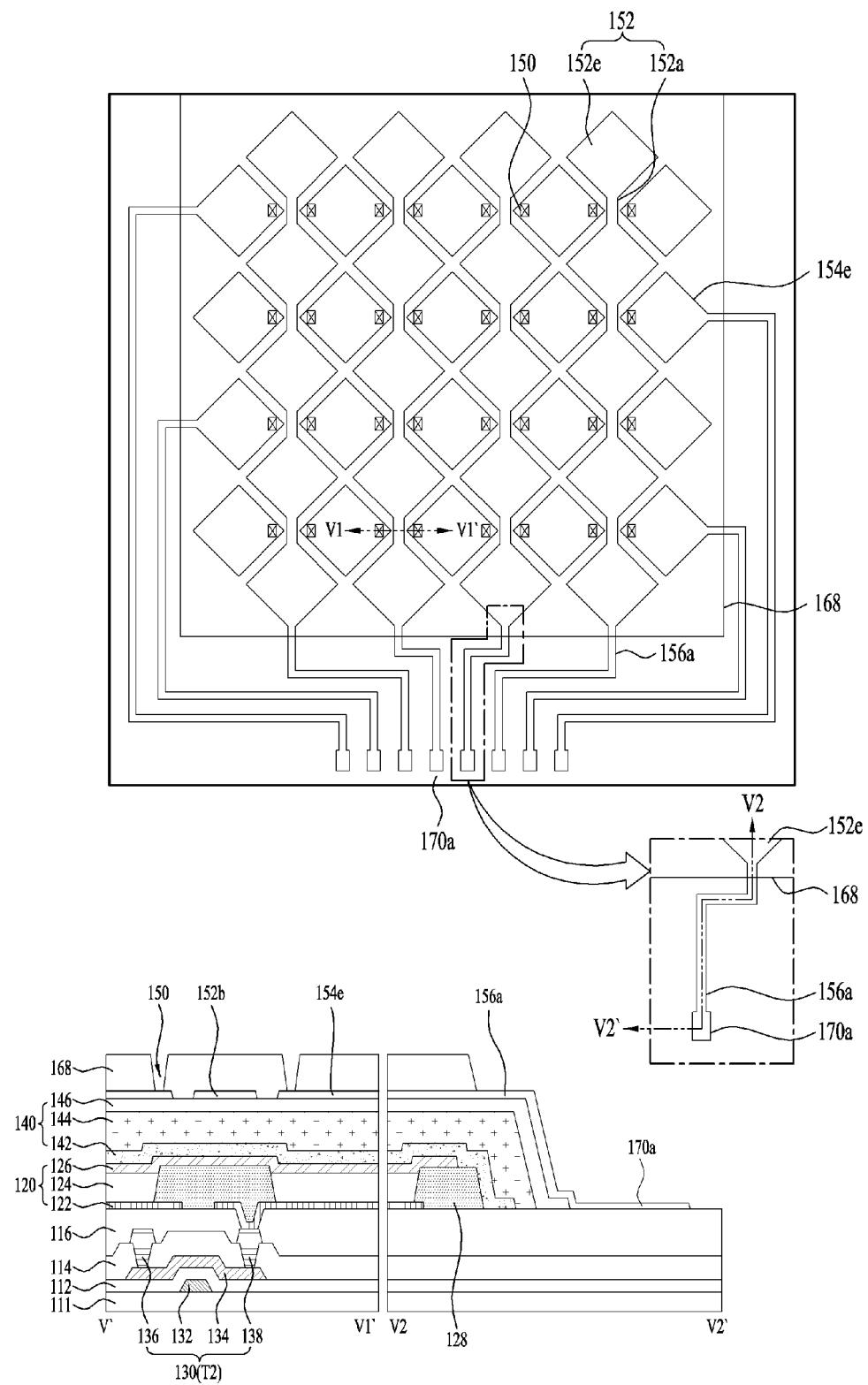
Figure 17C:
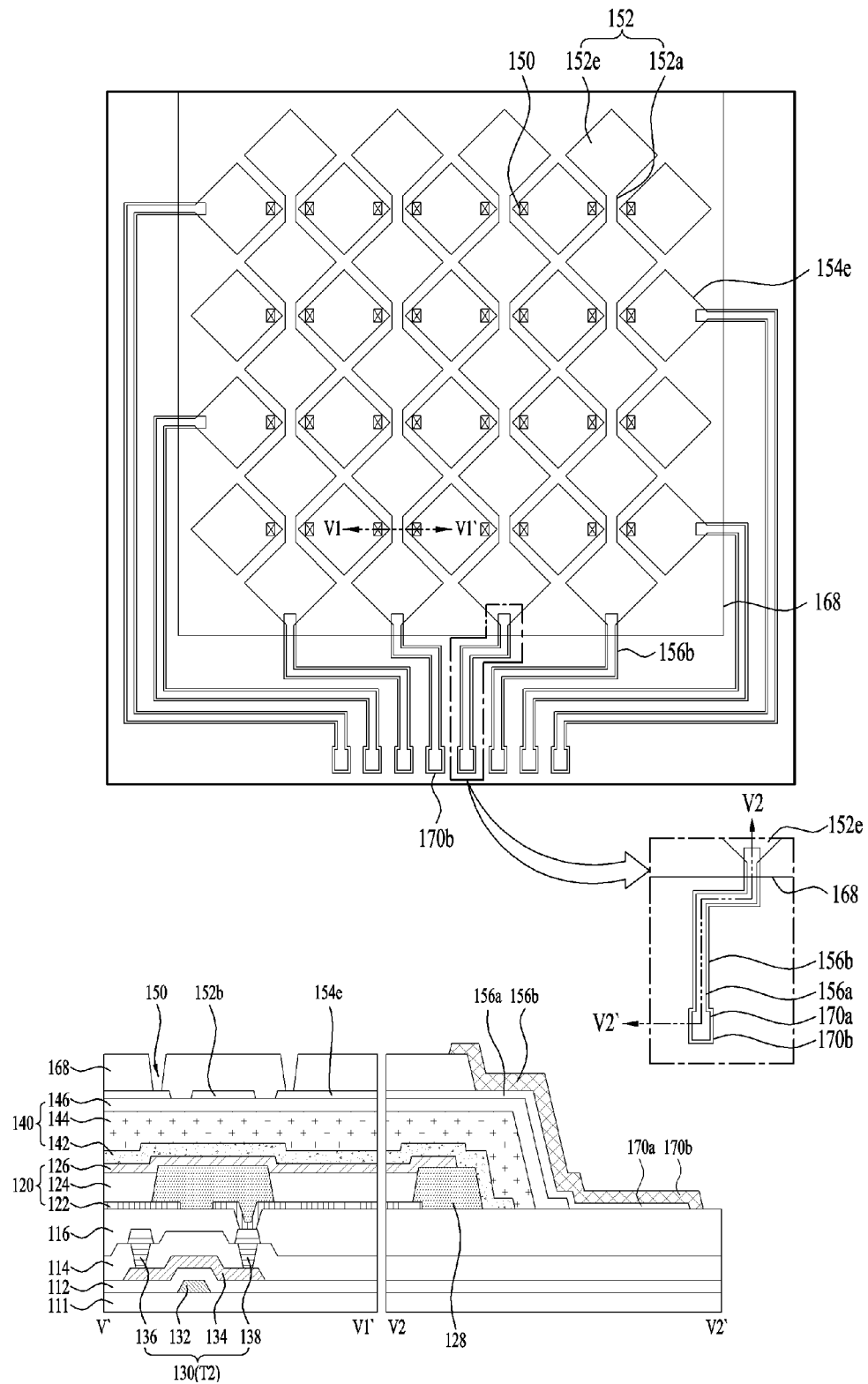
Figure 17D:
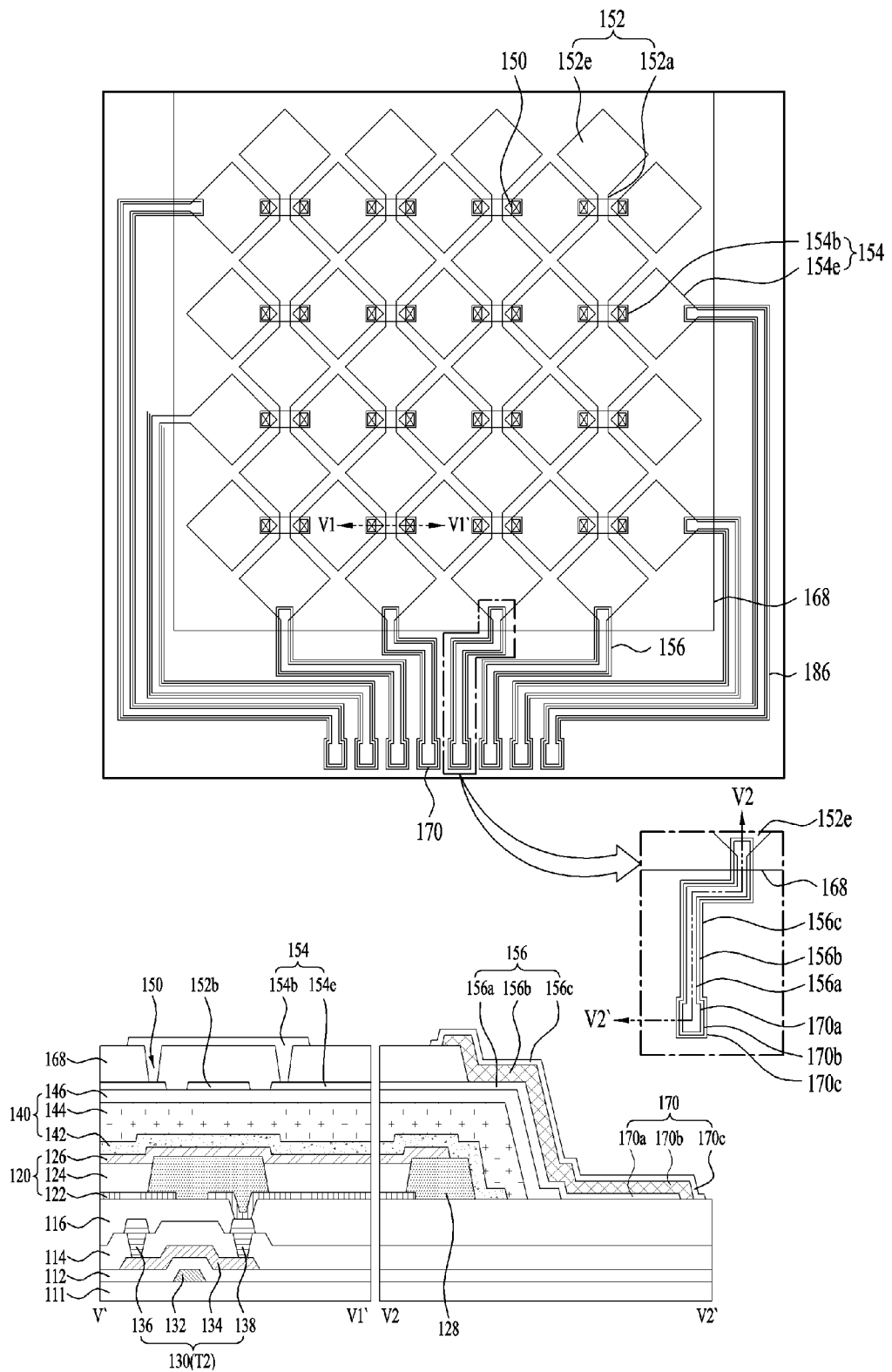
Figure 17E:
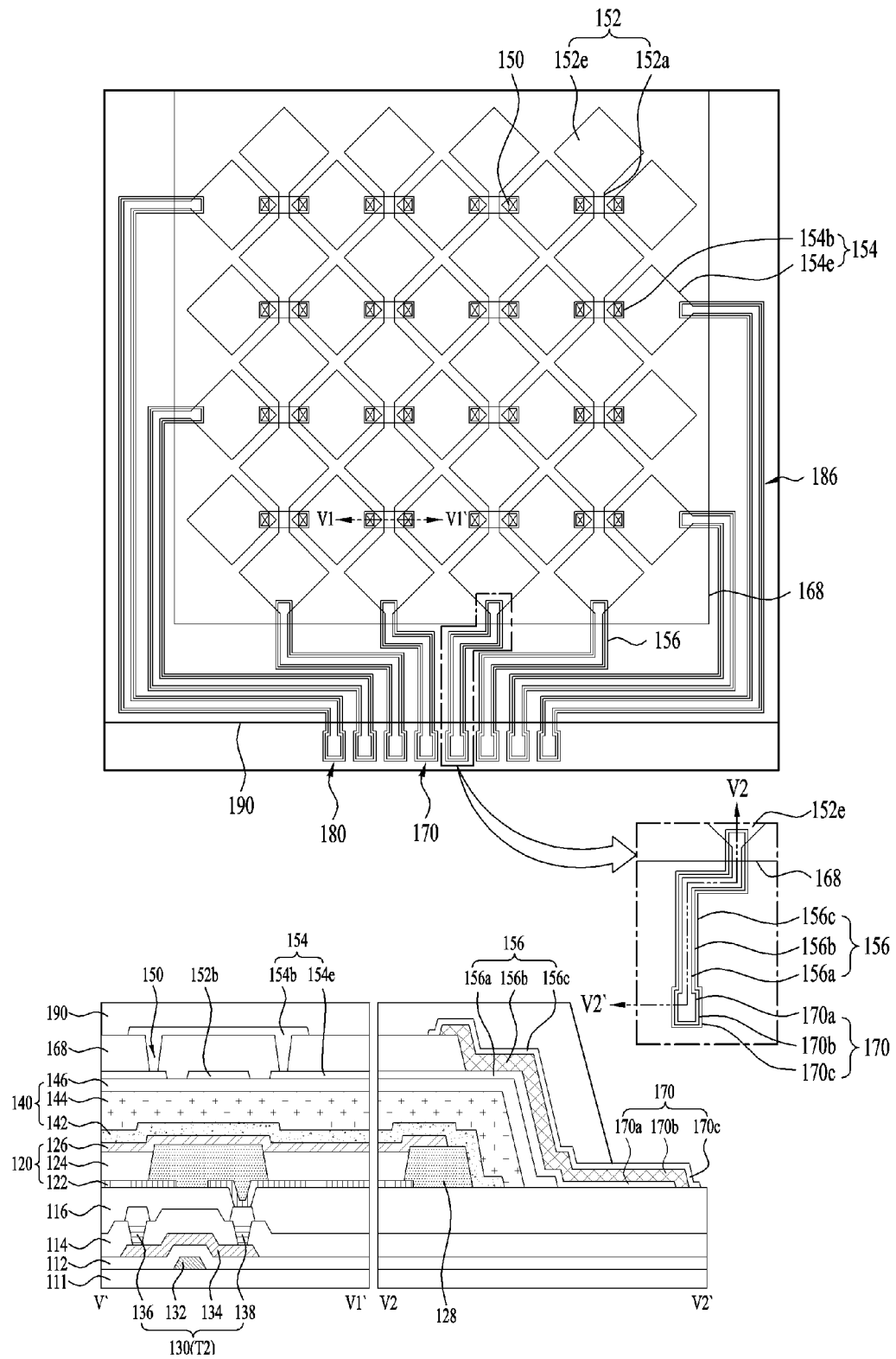

Further, if etching characteristics (for example, etching gases or etching solutions) of materials of the second and third routing layers 156b and 156c are the same, the third routing layer 156c is formed on the second routing layer 156b to have the same line width as that of the second routing layer 156b, as exemplarily shown in FIG. 16A, or is formed on the second routing layer 156b to have a greater line width than that of the second routing layer 156b, as exemplarily shown in FIGS. 16B and 16C. If etching characteristics of materials of the second and third routing layers 156b and 156c are different, the third routing layer 156c is formed on the second routing layer 156b to have a line width which is the same as or different from that of the second routing layer 156b. For example, the third routing layer 156c may be formed on the second routing layer 156b to have a narrower line width than that of the second routing layer 156b.

As such, each of the first and second routing lines 156 and 186 is formed to have a multilayer structure and, if a break in any one of a plurality of routing conductive layers included in each of the first and second routing lines 156 and 186 occurs, each of a touch driving pulse and a touch signal is transmitted through the remaining routing conductive layers.

Each of the touch driving pads 170 and the touch sensing pads 180 is formed to have a tri-layer structure in the same manner as the first and second routing lines 156 and 186. That is, each of the touch driving pads 170 and the touch sensing pads 180 has a tri-layer structure acquired by stacking the first to third pad layers 170a to 170c using the first to third conductive layers.

As described above, the organic light emitting display in accordance with this embodiment of the present disclosure includes the first and second routing lines 156 and 186 having a multilayer structure, thus preventing a break of the first and second routing lines 156 and 186. Further, while a touchscreen is attached to a conventional organic light emitting display by an adhesive, in the organic light emitting display in accordance with the present disclosure, the touch electrodes 152e and 154e are directly stacked on the encapsulation part 140 without a separate attachment process and thus the overall fabrication process may be simplified and manufacturing costs may be reduced.

FIGS. 17A to 17E are views illustrating a method of fabricating the organic light emitting display shown in FIG. 15.

First, a first conductive layer is deposited on the whole surface of the encapsulation part 140 through a deposition process and, then, the first conductive layer is patterned through a photolithography process using a first mask and an etching process. Thereby, the first bridges 152b, the first and second touch electrodes 152e and 154e, the first routing layer 156a and the first pad layer 170a are formed on the encapsulation part 140, as exemplarily shown in FIG. 17A. Here, the first conductive layer employs a transparent conductive film, such as ITO, IZO, ZnO, IGZO or ITO/Ag/ITO, or a conductive polymer.

Thereafter, a touch insulating film 168 to expose the second routing layer 156b and the second pad layer 170b is formed by depositing an inorganic or organic insulating material on the substrate 111 provided with the first bridges 152b, the first and second touch electrodes 152e and 154e, the first routing layer 156a and the first pad layer 170a formed thereon through a deposition process using a metal mask. Thereafter, touch contact holes 150 are formed by patterning the touch insulating film 168 through a photolithography process using a second mask and an etching process, as exemplarily shown in FIG. 17B.

Thereafter, a second conductive layer is deposited on the whole surface of the substrate 111 provided with the touch insulating film 168 having the touch contact holes 150 formed thereon through a deposition process and, then, the second conductive layer is patterned through a photolithography process using a third mask and an etching process. Thereby, the second routing layer 156b and the second pad layer 170b are formed on the touch insulating film 168, as exemplarily shown in FIG. 17C. Here, the second conductive layer is formed to have a monolayer structure or a multilayer structure using metals having high corrosion resistance and high acid resistance, such as Al, Ti, Cu, Mo and MoTi.

Thereafter, a third conductive layer is deposited on the whole surface of the substrate 111 provided with the second routing layer 156b and the second pad layer 170b through a deposition process and, then, the third conductive layer is patterned through a photolithography process using a fourth mask and an etching process. Thereby, the second bridges 154b, the third routing layer 156c and the third pad layer 170c are formed, as exemplarily shown in FIG. 17D. Here, the third conductive layer employs a transparent conductive film, such as ITO, IZO, ZnO, IGZO or ITO/Ag/ITO, or a conductive polymer.

Thereafter, an organic insulating material is applied to the whole surface of the substrate 111 provided with the second bridges 154b, the third routing layer 156c and the third pad layer 170c formed thereon and, then, the organic insulating material is patterned through a photolithography process using a fifth mask and an etching process. Thereby, a touch protective film 190 to expose the third pad layer 170c of each of the touch driving pads 170 and the touch sensing pads 180 is formed, as exemplarily shown in FIG. 17E.

As described above, in this embodiment of the present invention, the conductive layers on the encapsulation part 140 form a double-layer structure and the routing layers included in the routing lines 156 and 186 form a tri-layer structure. In this case, each of the first and third conductive layers on the encapsulation part 140 is formed simultaneously as one of the first to third routing layers 156a, 156b and 156c which is formed of the same material as the corresponding conductive layer. That is, the first bridges 152b formed of the first conductive layer are formed simultaneously with the first routing layer 156a, and the second bridges 154b formed of the third conductive layer are formed simultaneously with the third routing layer 156c.

Figure 18:
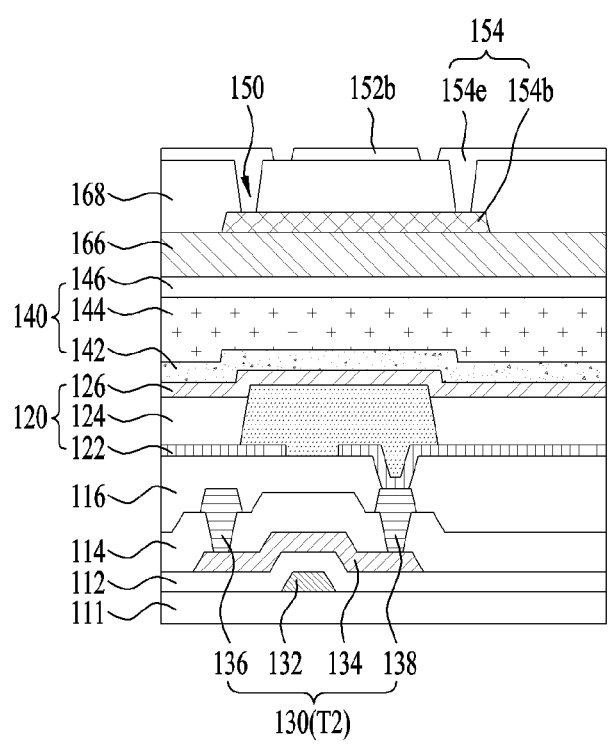
FIG. 18 is a cross-sectional view of an organic light emitting display having a touch buffer film in accordance with the present disclosure.

An organic light emitting display in accordance with the present disclosure may include a touch buffer film 166 disposed between a first conductive layer forming first bridges 152b or second bridges 154b and an encapsulation part 140, as exemplarily shown in FIG. 18. The touch buffer film 166 is formed between each of touch sensing lines 154 and touch driving lines 152 and a light emitting device 120 and maintains a distance of at least 5 μm between each of the touch sensing lines 154 and the touch driving lines 152 and a cathode 126. Thereby, parasitic capacitance between each of the touch sensing lines 154 and the touch driving lines 152 and the cathode 126 may be minimized and thus interaction between each of the touch sensing lines 154 and the touch driving lines 152 and the cathode 126 due to coupling therebetween may be prevented.

Figure 19:
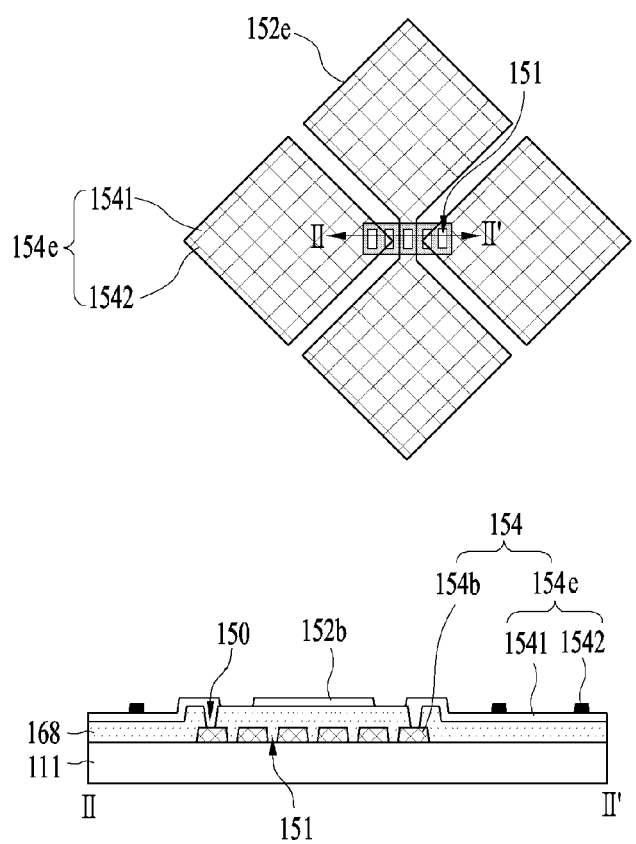
FIG. 19 is a view illustrating first and second touch electrodes of an organic light emitting display in accordance with another embodiment.

Further, although the embodiments exemplarily describe the first and second touch electrodes 152e and 154e of the organic light emitting display as being formed of the second conductive layer which is a plate-type transparent conductive layer, the first and second touch electrodes 152e and 154e may be formed in a mesh type, as exemplarily shown in FIG. 19. That is, each of the first and second touch electrodes 152e and 154e may include a transparent conductive layer 1541 and a mesh metal film 1542 formed in a mesh type on the upper or lower surface of the transparent conductive layer 1541. Otherwise, each of the first and second touch electrodes 152e and 154e may include a mesh metal film 1542 without a transparent conductive layer 1541, or include a transparent conductive layer 1541 without a mesh metal film 1542. Here, the mesh metal film 1542 has higher conductivity than the transparent conductive layer 1541 and may thus form low-resistance electrodes as the first and second touch electrodes 152e and 154e. Thereby, resistances and capacitances of the touch electrodes 152e and 154e are reduced and a time constant RC is reduced, thus improving touch sensitivity. Further, the mesh metal film 1542 has a greatly thin line width and may thus prevent an aperture ratio and transmittance from being lowered due to the mesh metal film 1542. Further, bridges 154b disposed on a plane different from the touch electrodes 152e and 154e may include a plurality of slits 151, as exemplarily shown in FIG. 19. Thereby, the bridges 154b provided with slits 151 may have a reduced area, as compared to bridges provided with no slits. Therefore, reflection of external light by the bridges 154b may be reduced and thus lowering of visibility may be prevented. The bridges 154b provided with the slits 151 are formed of a transparent conductive layer or an opaque conductive layer. If the bridges 154b are formed of an opaque conductive layer, the bridges 154b overlap banks, thus preventing lowering of an aperture ratio.

As apparent from the above description, an organic light emitting display having touch sensors in accordance with the present disclosure includes first and second routing lines having a multilayer structure and, thus, a break of the first and second routing lines may be prevented. Further, in the organic light emitting display in accordance with the present disclosure, touch electrodes are directly disposed within an encapsulation part without an adhesive and thus a separate attachment process is omitted, thereby simplifying the overall fabrication process and reducing manufacturing costs.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a light-emitting device disposed on a substrate;
   an encapsulation unit disposed on the light-emitting device;
   a plurality of touch electrodes disposed on the encapsulation unit; and
   a routing line connected to the touch electrodes, the routing line being configured to have a structure in which a plurality of conductive films is stacked, wherein
   at least one of the conductive films is configured to have a multi-layered structure.

2. The display device according to claim 1, wherein the touch electrodes comprise:
   a plurality of first touch electrodes arranged in a first direction, the first touch electrodes being connected to each other via a first bridge; and
   a plurality of second touch electrodes arranged in a second direction, which intersects the first direction, the second touch electrodes being connected to each other via a second bridge.

3. The display device according to claim 2, further comprising:
   a touch dielectric film disposed between the first bridge and the second bridge, wherein
   the first touch electrodes, the second touch electrodes, and the first bridge are disposed on the encapsulation unit,
   the second bridge is disposed on the touch dielectric film, and
   the second bridge is connected to the second touch electrodes, which are exposed through touch contact holes formed through the touch dielectric film.

4. The display device according to claim 3, further comprising an auxiliary bridge disposed between the first bridge and the encapsulation unit, the auxiliary bridge being connected to the first bridge.

5. The display device according to claim 3, further comprising:
   a touch dielectric film disposed between the first bridge and the second bridge, wherein
   the second bridge is disposed on the encapsulation unit,
   the first touch electrodes, the second touch electrodes, and the first bridge are disposed on the touch dielectric film, and
   the second touch electrodes are connected to the second bridge, which is exposed through a touch contact hole formed through the touch dielectric film.

6. The display device according to claim 3, wherein the second bridge is disposed between the first touch electrodes, the second touch electrodes, and the encapsulation unit.

7. The display device according to claim 1, wherein at least one of the conductive films is configured to have a multi-layered structure comprising one of Al, Ti, Cu, Mo, ITO, and IZO.

8. The display device according to claim 1, wherein at least one of the conductive films comprises one of Ti/Al/Ti and Mo/Al/Mo.

9. The display device according to claim 2, wherein at least one of the first touch electrodes, the second touch electrodes, the first bridge, or the second bridge comprises a mesh-shaped conductive film having an opening formed therein.

10. The display device according to claim 9, wherein the mesh-shaped conductive film overlaps a bank configured to define a light-emitting region of the light-emitting device.

11. The display device according to claim 10, wherein the opening overlaps the light-emitting region.

12. The display device according to claim 10, wherein the bank is disposed such that the opening has a diamond shape.

13. The display device according to claim 10, wherein the mesh-shaped conductive film is disposed along the bank.

14. The display device according to claim 1, wherein the routing line is formed along a side surface of the encapsulation unit.

15. The display device according to claim 1, wherein the routing line contacts a side surface of the encapsulation unit.

16. The display device according to claim 1, further comprising a touch buffer film disposed between the encapsulation unit and the touch electrodes.

17. The display device according to claim 16, wherein the routing line is formed along a side surface of the touch buffer film.

18. The display device according to claim 16, wherein the routing line contacts a side surface of the touch buffer film.

19. The display device according to claim 1, wherein the display device is bendable and curvable.

20. The display device according to claim 19, wherein an organic layer is disposed in a bendable and curvable region of the display device.

21. The display device according to claim 2, wherein the routing line is configured to have a structure in which a plurality of routing layers, comprising a lower routing layer and an upper routing layer, is stacked.

22. The display device according to claim 21, wherein
the lower routing layer and the upper routing layer have different widths, and
the lower routing layer and the upper routing layer have different thicknesses.

23. The display device according to claim 22, wherein
a width of the lower routing layer is larger than a width of the upper routing layer, and
a thickness of the upper routing layer is larger than a thickness of the lower routing layer.

24. The display device according to claim 22, wherein
the lower routing layer is disposed on a same layer and is made of a same material as one of the first bridge and the second bridge, and
the upper routing layer is disposed on a same layer and is made of a same material as the other of the first bridge and the second bridge.

25. The display device according to claim 21, further comprising:
a touch pad connected to the routing line, wherein
at least one of the upper routing layer or the lower routing layer is connected to the touch pad.

26. The display device according to claim 21, wherein the upper routing layer and the lower routing layer overlap each other on at least a portion of the encapsulation unit.

27. The display device according to claim 21, further comprising an interlayer film disposed between the upper routing layer and the lower routing layer.

28. The display device according to claim 27, wherein the interlayer film comprises one of a transparent conductive film and a transparent dielectric film.

29. The display device according to claim 27, wherein at least one of the upper routing layer, the lower routing layer, or the interlayer film comprises one of Ti/Al/Ti and Mo/Al/Mo.

30. The display device according to claim 2, further comprising:
a touch pad connected to the routing line, wherein
the touch pad is configured to have a structure in which a plurality of pad layers is stacked.

31. The display device according to claim 30, wherein at least one of the pad layers is configured to have a multi-layered structure.

32. The display device according to claim 30, wherein at least one of the pad layers comprises one of Ti/Al/Ti and Mo/Al/Mo.

33. The display device according to claim 30, wherein at least one of the pad layers is disposed on a same layer and is made of a same material as at least one of the first bridge or the second bridge.

34. The display device according to claim 30, wherein a total number of routing lines extending from a left side and a right side of the display device to the touch pad is equal to or different from a total number of routing lines extending from an upper side and a lower side of the display device to the touch pad.

35. The display device according to claim 30, further comprising:
a thin film transistor connected to the light-emitting device, wherein
the thin film transistor comprises:
a gate electrode disposed on the substrate;
an active layer disposed on or under the gate electrode;
a source electrode connected to the active layer; and
a drain electrode connected to the active layer.

36. The display device according to claim 35, wherein the routing line and the touch pad, disposed at an outer edge of the substrate, are disposed on one of a plurality of dielectric films located between the light-emitting device and the substrate.

37. The display device according to claim 36, wherein the dielectric films comprise:
a gate dielectric film disposed on the gate electrode and the active layer of the thin film transistor;
a passivation film disposed between the source and drain electrodes and the active layer of the thin film transistor; and
a planarization layer disposed on the source and drain electrodes.

38. The display device according to claim 37, wherein the routing line overlaps at least one of the gate dielectric film, the passivation film, a bank configured to define a light-emitting region of the light-emitting device, the planarization layer, or the encapsulation unit at the outer edge of the substrate.

39. The display device according to claim 1, wherein a distance between the substrate and the routing line is smaller than a distance between the substrate and the touch electrodes.

40. The display device according to claim 1, wherein
the encapsulation unit comprises first and second inorganic encapsulation layers that face each other in a state in which an organic encapsulation layer is disposed therebetween,
the second inorganic encapsulation layer is disposed so as to cover an upper surface and a side surface of the organic encapsulation layer, and
the organic encapsulation layer is disposed so as to cover an upper surface and a side surface of the first inorganic encapsulation layer.

* * * * *